(12) United States Patent
Uchiyama

(10) Patent No.: US 8,395,198 B2
(45) Date of Patent: Mar. 12, 2013

(54) SEMICONDUCTOR DEVICE THAT USES A TRANSISTOR FOR FIELD SHIELD

(75) Inventor: Hiroyuki Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 38 days.

(21) Appl. No.: 13/183,963

(22) Filed: Jul. 15, 2011

(65) Prior Publication Data

US 2012/0012927 A1    Jan. 19, 2012

(30) Foreign Application Priority Data

Jul. 15, 2010 (JP) .................................. 2010-160981
Apr. 22, 2011 (JP) .................................. 2011-095621

(51) Int. Cl.
   H01L 27/108      (2006.01)
   H01L 29/94       (2006.01)
(52) U.S. Cl. .. 257/296; 257/331; 257/332; 257/E27.088
(58) Field of Classification Search .................. 257/296, 257/302, 330, 331, 332, 334, E27.088
   See application file for complete search history.

(56) References Cited

U.S. PATENT DOCUMENTS

| 6,806,533 | B2 * | 10/2004 | Henninger et al. ........... 257/328 |
| 7,638,841 | B2 * | 12/2009 | Challa ........................... 257/341 |
| 7,772,065 | B2   | 8/2010  | Ohuchi |
| 8,274,113 | B1 * | 9/2012  | Hsieh ............................. 257/334 |
| 2003/0146461 | A1 * | 8/2003 | Beer et al. ..................... 257/296 |
| 2010/0072544 | A1 * | 3/2010 | Pearse et al. .................. 257/331 |
| 2010/0123193 | A1 * | 5/2010 | Burke et al. .................. 257/334 |
| 2011/0254086 | A1 * | 10/2011 | Hsieh ............................. 257/330 |
| 2012/0043602 | A1 * | 2/2012 | Zeng et al. .................... 257/330 |
| 2012/0211828 | A1 * | 8/2012 | Bobde et al. .................. 257/330 |

FOREIGN PATENT DOCUMENTS

JP    2008-192681    8/2008

* cited by examiner

Primary Examiner — Ngan Ngo
(74) Attorney, Agent, or Firm — Young & Thompson

(57) ABSTRACT

A semiconductor device includes: a cell gate trench with a bottom face and first/second side faces; a field-shield gate trench narrower than the cell gate trench; a first upper diffusion layer between the cell gate trench and the field-shield gate trench; a second upper diffusion layer on the opposite side of the cell gate trench from the first upper diffusion layer; a third upper diffusion layer on the opposite side of the field-shield gate trench from the first upper diffusion layer; a lower diffusion layer on the bottom face of the cell gate trench; first and second storage elements electrically connected to the first and second upper diffusion layers, respectively; a bit line electrically connected to the lower diffusion layer; a word line covering first and second side faces via a gate insulating film; and a field-shield gate electrode in the field-shield gate trench via a gate insulating film.

13 Claims, 26 Drawing Sheets

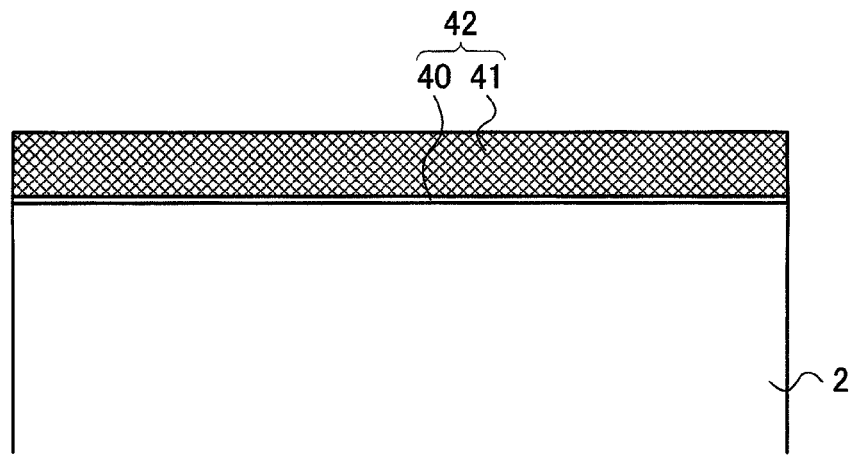
FIG.7A
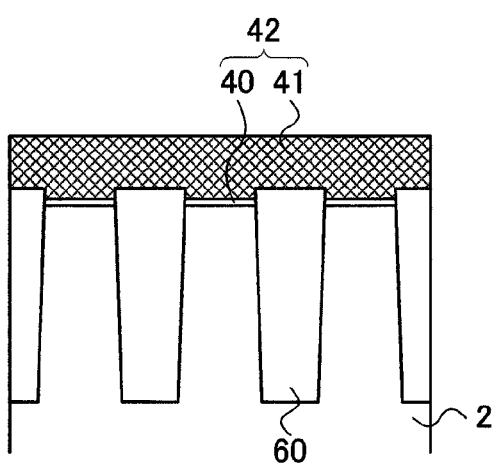 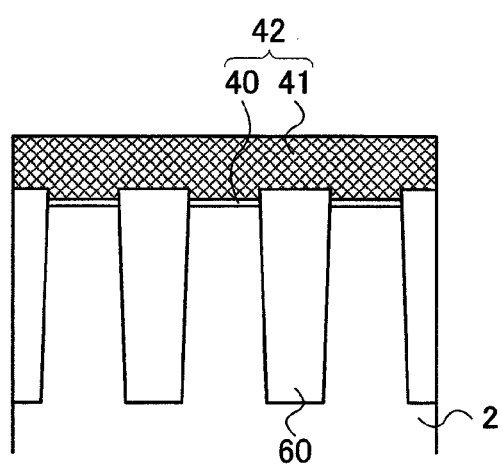
FIG.7B  FIG.7C

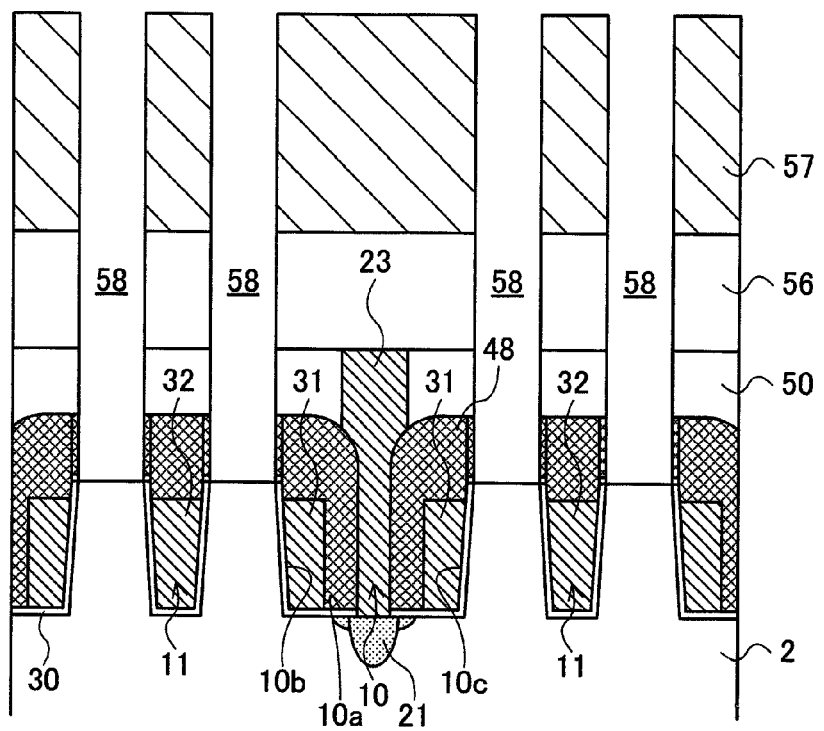
FIG.24A
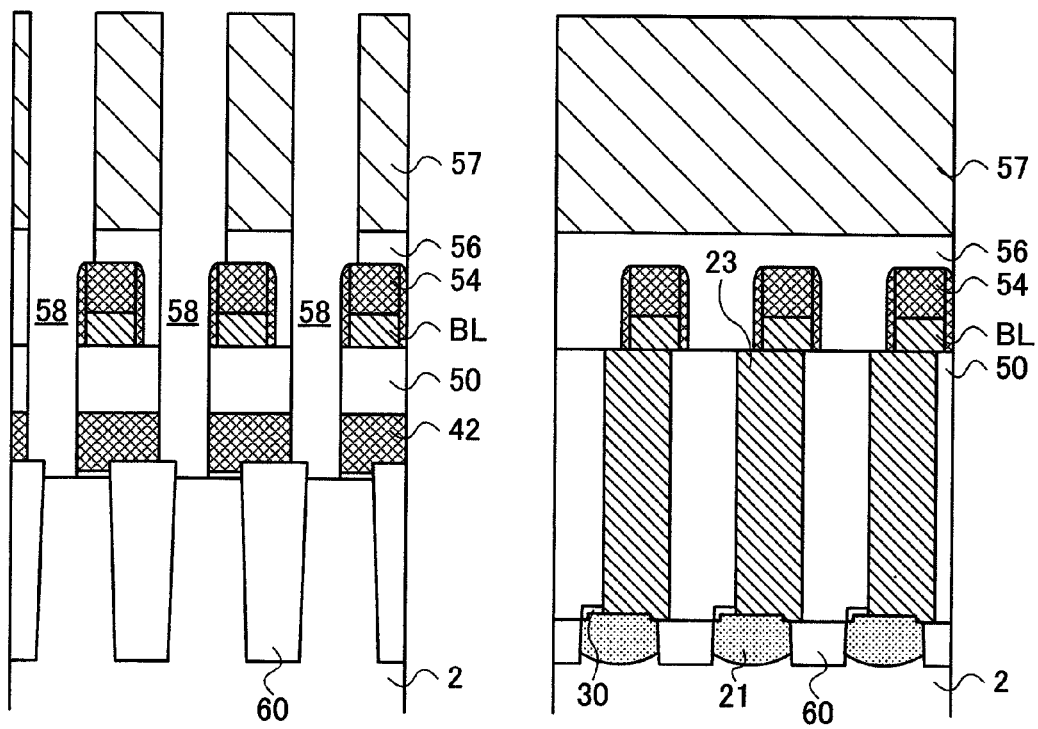
FIG.24B                    FIG.24C

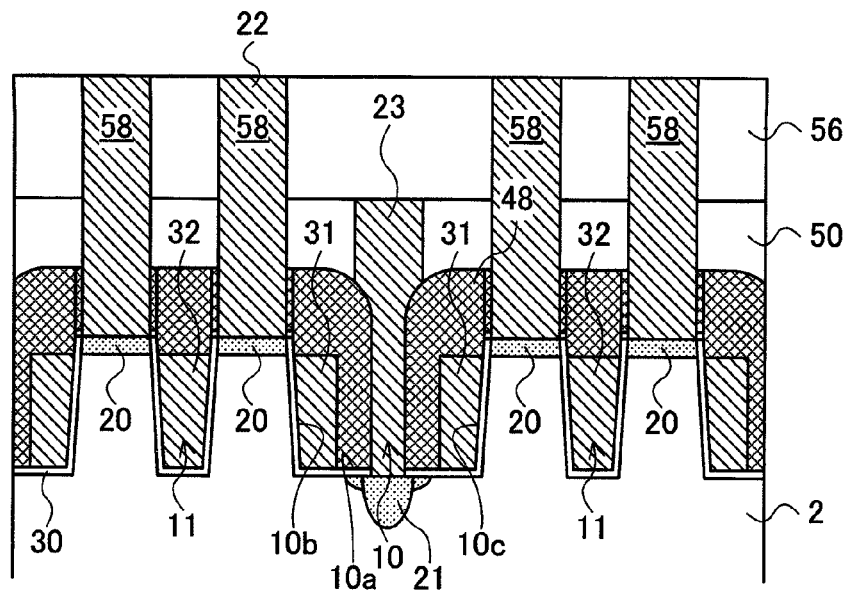
FIG.25A
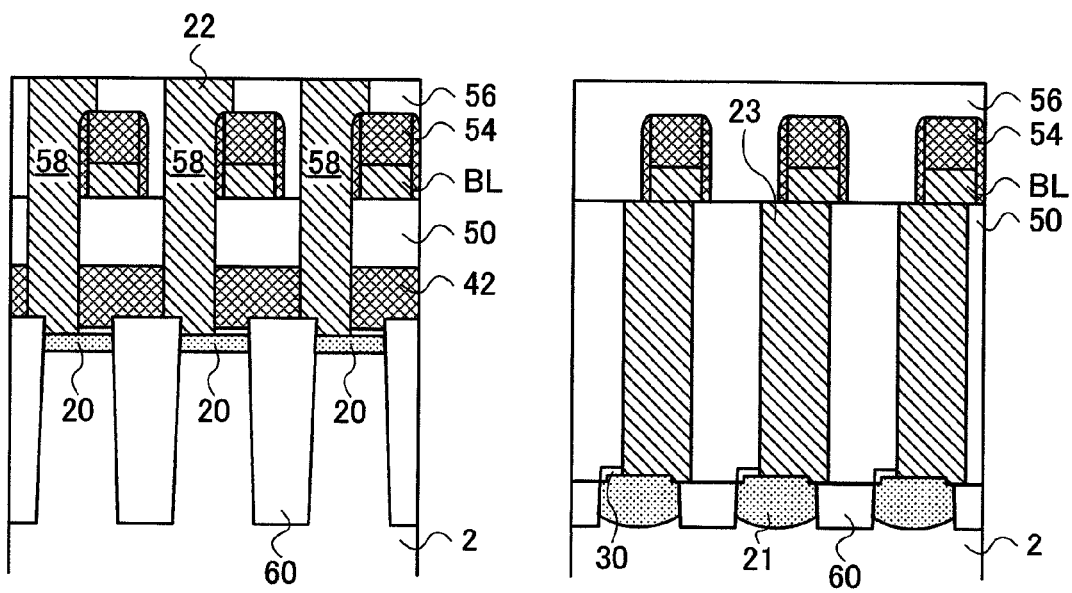
FIG.25B
FIG.25C

SEMICONDUCTOR DEVICE THAT USES A TRANSISTOR FOR FIELD SHIELD

BACKGROUND OF THE INVENTION

1. Field of the Invention

The present invention relates to a semiconductor device and a method of manufacturing the semiconductor device, and particularly to a semiconductor device that uses a transistor for field shield and a method of manufacturing the semiconductor device.

2. Description of Related Art

As for a semiconductor device such as DRAM (Dynamic Random Access Memory), there is a semiconductor device in which a large number of ward lines having the same structure are disposed in parallel and the first out of every three word lines is regarded as a dummy word line to isolate active fields (see Japanese Patent Application Laid-Open No. 2008-192681). The other word lines (word lines that are not dummy word lines) make up gate electrodes of cell transistors. According to the configuration, when seen in the direction of a bit line, there are two cell transistors included in one active field.

SUMMARY

In the example of Japanese Patent Application Laid-Open No. 2008-192681, an element isolation region is formed in an area right below a dummy word line. Meanwhile, in recent years, what has been also examined is to realize element isolation by supplying a predetermined level of low voltage to a dummy word line without providing such an element isolation region. The following provides a detailed description of the above.

Word lines, including dummy word lines, all have the same structure. Therefore, on both sides of a dummy word line in the direction of a bit line, as in the case of a word line, impurity diffusion regions are formed. The impurity diffusion regions and dummy word lines make up transistors (field-shield transistors). A voltage less than a threshold voltage of the field-shield transistor is constantly supplied to the dummy word line. Accordingly, the field-shield transistor is constantly off with no flow of drain current, resulting in the realization of element isolation between active fields.

By the way, the inventor of the present invention has so far developed a memory cell of a single-side sidewall gate type, which is a type of memory cell that uses, as word lines, sidewall conducting films that are formed on both side surfaces of a trench (gate trench) extending in the direction of a word line. In one trench, two word lines are formed in total, one for one side face. As a result, the width of a word line is less than a minimum processing size, making cell pitches smaller than a conventional-type memory cell.

However, in the memory cell of a single-side sidewall gate type, the gate length of a cell transistor is substantially equal to the depth of a trench and very short. The gate length of a field-shield transistor is also very short, weakening an element isolation function of the field-shield transistor.

In one embodiment, there is provided a semiconductor device, comprising: a semiconductor substrate including first, second and third portions; the first and second portions being partitioned by a cell gate trench having a bottom surface, a first side surface located on the first portion side, and a second side surface located on the second portion side, the first and third portions being partitioned by a first field-shield gate trench exposing a third side surface located on the first portion side and a fourth side surface located on the third portion side, and a distance between the third and fourth surfaces being narrower than a distance between the first and second surfaces, a first upper diffusion layer that is provided on an upper part of the first portion of the semiconductor substrate; a second upper diffusion layer that is provided on an upper part of the second portion of the semiconductor substrate; a third upper diffusion layer that is provided on an upper part of the third portion of the semiconductor substrate; a lower diffusion layer that is provided in the bottom surface of the cell gate trench; a first and a second storage element that are electrically connected to the first and second upper diffusion layers, respectively; a bit line that is electrically connected to the lower diffusion layer; a first and a second cell gate electrode that cover the first and second side surfaces, respectively, via a gate insulating film; and a first field-shield gate electrode that is embedded in the first field-shield gate trench via a gate insulating film.

In another embodiment, there is provided a semiconductor device, comprising: a semiconductor substrate having a plurality of cell gate trenches and a plurality of field-shield gate trenches that extend to a first direction in parallel, the cell gate trenches and the field-shield gate trenches are disposed so as to alternately appear in a second direction, each of the cell gate trenches exposing a bottom surface and first and second side surfaces of the semiconductor substrate, and each of the cell gate trenches is wider in the second direction than each of the field-shield gate trenches; a plurality of upper diffusion layers, each of which is provided on an upper part of the semiconductor substrate provided between an associated one of the cell gate trenches and an associated one of the field-shield gate trenches; a plurality of lower diffusion layers, each of which is provided in an associated one of the bottom surfaces; a plurality of storage elements, each of which is electrically connected to an associated one of the upper diffusion layers; a plurality of bit lines extending to the second direction, each of which is electrically connected to an associated one of the lower diffusion layers; a plurality of first cell gate electrodes, each of which covers the first side surface exposed on an associated one of the cell gate trenches via a gate insulating film; a plurality of second cell gate electrodes, each of which covers the second side surface exposed on an associated one of the cell gate trenches via a gate insulating film; and a plurality of field-shield gate electrodes, each of which is embedded in an associated one of the field-shield gate trenches via a gate insulating film.

In still another embodiment, there is provided a method of manufacturing a semiconductor device comprising: forming a cell gate trench and a field-shield gate trench on a semiconductor substrate, the cell gate trench having a bottom surface and first and second side surfaces, the field-shield gate trench being narrower in width than the cell gate trench; forming a gate insulating film on inner surfaces of the cell gate trench and the field-shield gate trench; forming a word-line material on the first and second side surfaces via the gate insulating film; forming a first insulating film comprising a first insulating material covering the word-line material; etching-back the first insulating film to form an opening on the first insulating film that exposes the bottom surface; implanting impurity through the opening to form a lower diffusion layer on the bottom surface; forming a bit line contact plug being in contact with the lower diffusion layer; implanting impurity in the semiconductor substrate provided between the cell gate trench and the field-shield gate trench to form an upper diffusion layer; and forming a storage node contact plug being in contact with the top diffusion layer.

In still another embodiment, there is provided a data processing system comprising: a data processor; and a memory device connected to the data processor, wherein the memory device comprising: a semiconductor substrate including first, second and third portions; the first and second portions being partitioned by a cell gate trench having a bottom surface, a first side surface located on the first portion side, and a second side surface located on the second portion side, the first and third portions being partitioned by a first field-shield gate trench exposing a third side surface located on the first portion side and a fourth side surface located on the third portion side, and a distance between the third and fourth surfaces being narrower than a distance between the first and second surfaces, a first upper diffusion layer that is provided on an upper part of the first portion of the semiconductor substrate; a second upper diffusion layer that is provided on an upper part of the second portion of the semiconductor substrate; a third upper diffusion layer that is provided on an upper part of the third portion of the semiconductor substrate; a lower diffusion layer that is provided in the bottom surface of the cell gate trench; a first and a second storage element that are electrically connected to the first and second upper diffusion layers, respectively; a bit line that is electrically connected to the lower diffusion layer; a first and a second cell gate electrode that cover the first and second side surfaces, respectively, via a gate insulating film; and a first field-shield gate electrode that is embedded in the first field-shield gate trench via a gate insulating film.

According to the present invention, the gate length of the field-shield transistor, which consists of the first field-shield gate electrode and the first and third upper diffusion layers, can be made longer than that of the related art.

BRIEF DESCRIPTION OF THE DRAWINGS

The above features and advantages of the present invention will be more apparent from the following description of certain preferred embodiments taken in conjunction with the accompanying drawings, in which:

FIG. 7A to 25C are diagrams each showing a process of manufacturing a semiconductor device according to a preferred embodiment of the present invention; FIG. 7A to 25A correspond to FIG. 5, FIG. 7B to 25B correspond to FIG. 6A, FIG. 7C to 25C correspond to FIG. 6B.

DETAILED DESCRIPTION OF THE EMBODIMENTS

Preferred embodiments of the present invention will be explained below in detail with reference to the accompanying drawings.

Figure 1:
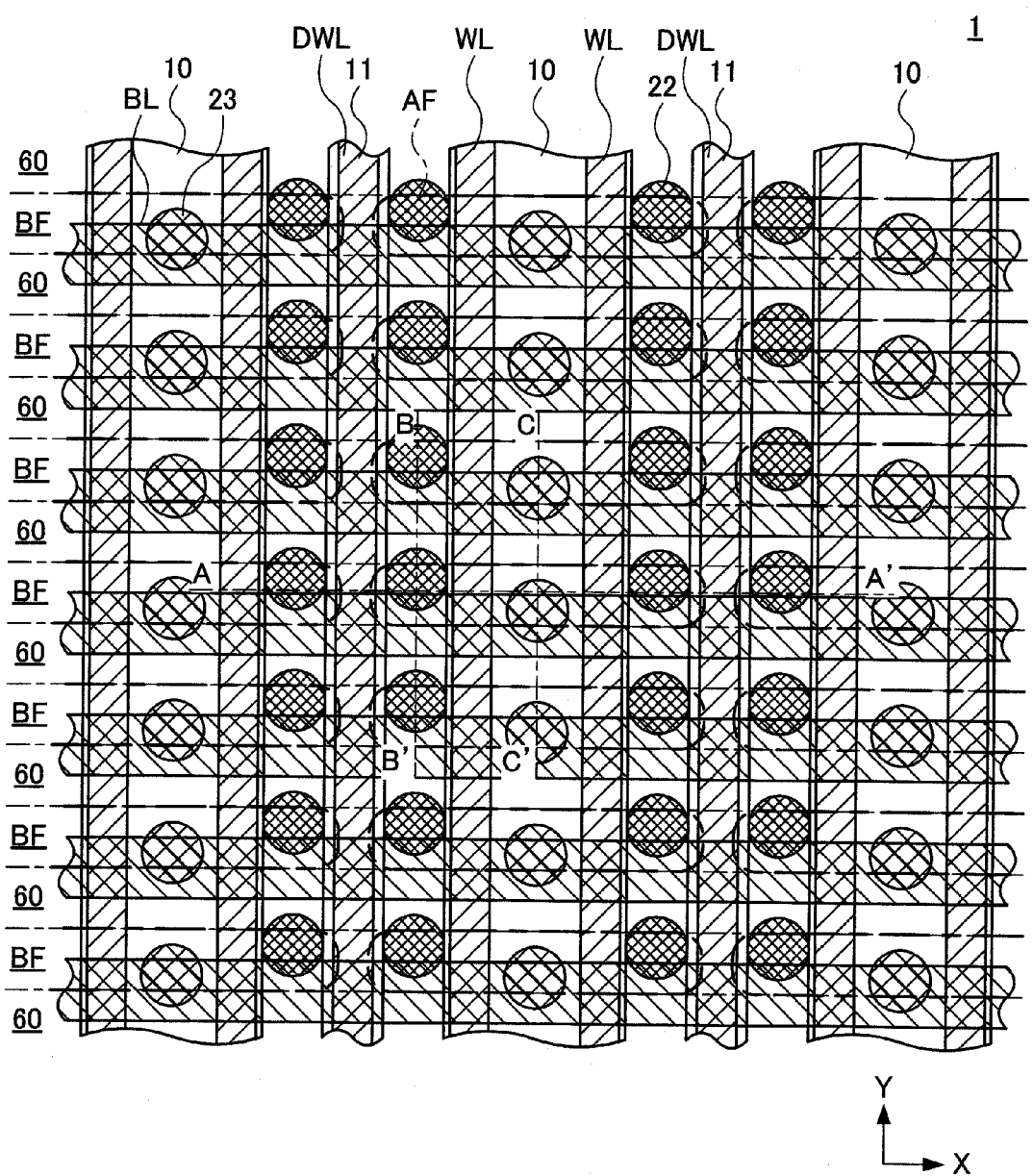
FIG. 1 is a two-dimensional diagram schematically showing a semiconductor device according to a preferred embodiment of the present invention.
Figure 2:
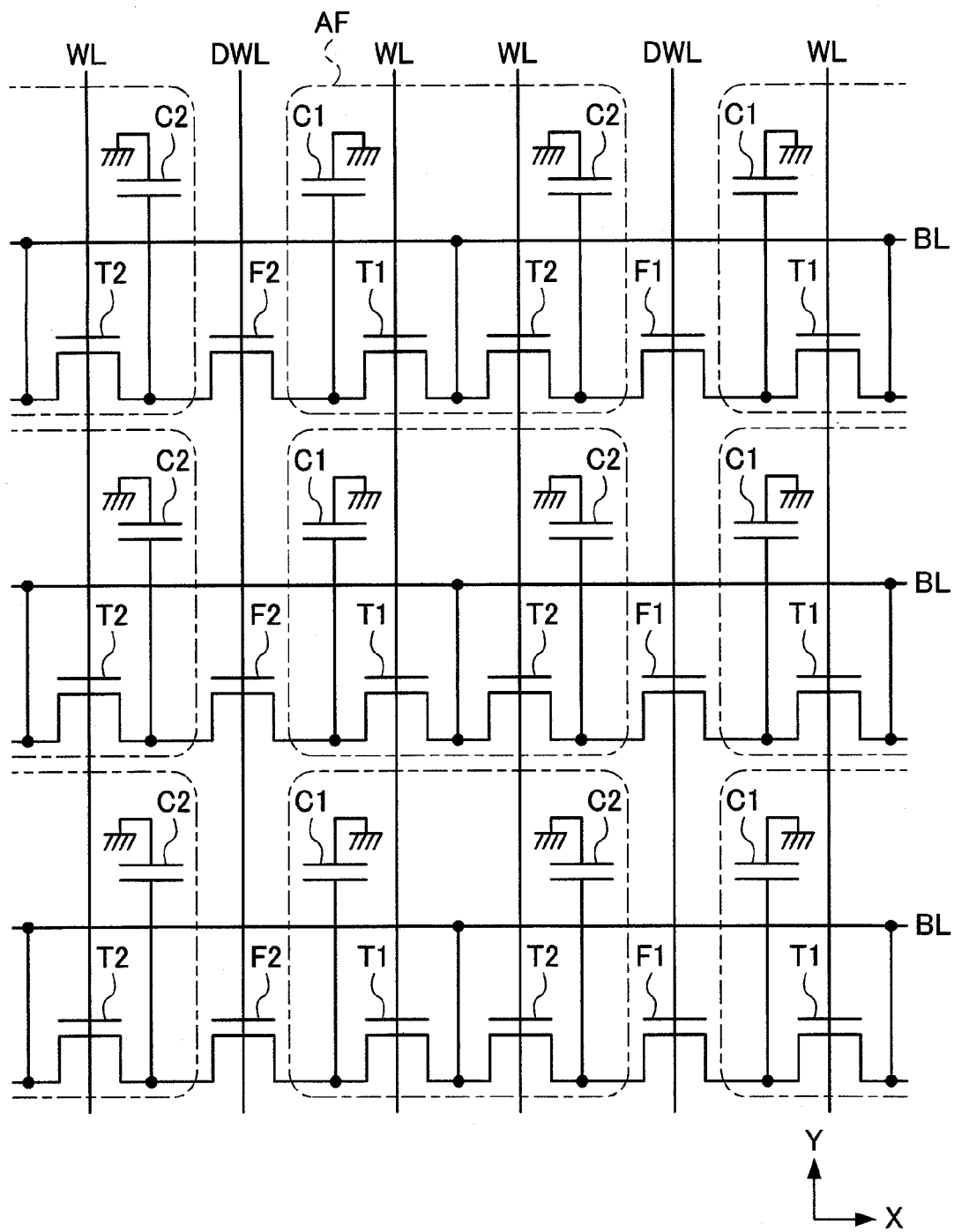
FIG. 2 is a circuit diagram showing the circuit configuration of the semiconductor device according to a preferred embodiment of the present invention.

FIG. 1 is a two-dimensional diagram schematically showing a semiconductor device 1 according to a preferred embodiment of the present invention. FIG. 2 is a circuit diagram showing the circuit configuration of the semiconductor device 1. The following describes in detail the configuration of the semiconductor device 1 with reference to the drawings.

Incidentally, in the present embodiment, the semiconductor device 1 is explained as a DRAM (Dynamic Random Access Memory) that uses cell capacitors as a storage element (storage node). However, the semiconductor device of the present invention is not limited to a DRAM. It is also preferred that the present invention be applied to other kinds of semiconductor device, for example to a PCRAM (Phase Change Random Access Memory), which uses a phase-change element as a storage element, and the like.

As shown in FIG. 1, the semiconductor device 1 includes a plurality of STIs (Shallow Trench Isolations) 60, which each extend in an X-direction and serve as an element isolation region; and a plurality of field-shield (FS) buried word lines (dummy word lines DWL), which each extend in a Y-direction. The STIs 60 are made up of insulating films that bury grooves formed on a silicon substrate, and are disposed at regular intervals in the Y-direction. On a surface of the silicon substrate, a plurality of belt-like active fields BF are mapped out by the STIs 60 so as to extend in the X-direction. The dummy word lines DWL were disposed in the X-direction at regular intervals, dividing each belt-like active field BF into a plurality of active fields AF. Each active field AF is in the shape of a rectangle having long and short sides, with the long-side direction thereof extending in the same X-direction as a bit line BL does. Overall, as shown in FIGS. 1 and 2, a plurality of active fields AF are arranged in a matrix pattern.

As shown in FIGS. 1 and 2, the semiconductor device 1 includes a plurality of bit lines PL, which straddle a plurality of active fields AF and extend in the X-direction (bit-line direction); and a plurality of word lines WL, which straddle a plurality of active fields AF and extend in the Y-direction (word-line direction), which is a direction perpendicular to the X direction. Two word lines WL are assigned to one active field AF so as to divide the long side. The dummy word lines DWL described above are part of a plurality of the word lines WL. One out of every three word lines WL is regarded as a dummy word line DWL. A dummy word line DWL is positioned between two active fields AF that are adjacent to each other in the X-direction. One bit line BL is assigned to one active field AF.

Each active field AF includes two memory cells. More specifically, as shown in FIG. 2, each active field AF includes a memory cell consisting of a cell transistor T1 (first cell transistor) and a cell capacitor C1 (first storage element), and a memory cell consisting of a cell transistor T2 (second cell transistor) and a cell capacitor C2 (second storage element). The gate electrodes of the cell transistors T1 and T2 are each made up of one or the other of the two word lines WL assigned to each active field AF.

The cell transistors T1 and T2 are disposed side by side in the X-direction. The cell transistors T1 and T2 are each connected to the corresponding cell capacitors C1 and C2 through storage node contact plugs 22 shown in FIG. 1. The cell transistors T1 and T2 are connected to common bit lines BL through bit line contact plugs 23 shown in FIG. 1.

As shown in FIG. 2, a field-shield transistor F1 (first field-shield transistor) is provided on one side of an active field AF in the X-direct, and a field-shield transistor F2 (second field-shield transistor) on the other side. The gate electrodes of the field-shield transistors F1 and F2 are each made up of dummy word lines DWL provided on one and the other side of each active field AF in the X-direction.

A voltage less than a threshold voltage of the field-shield transistors F1 and F2 is constantly supplied from a voltage source, not shown in the diagram, to each dummy word line DWL. In a typical case, the voltage applied to each dummy word line DWL is opposite in polarity to the voltage applied to a word line WL of a cell transistor. For example, when a voltage of 1V is applied to a word line WL of a cell transistor, a voltage of −1V is applied to a dummy word line DWL. As a result, the field-shield transistors F1 and F2 are constantly off and do not function as transistors. Therefore, the movement of electric charges over the active fields AF sitting side by side in the X-direction does not occur. That is, element isolation becomes realized between the active fields AF sitting side by side in the X-direction.

The word lines WL and dummy word lines DWL are placed in trenches provided on a surface of the silicon substrate. The following describes in detail how the word lines WL and dummy word lines DWL are placed with reference to FIG. 3.

Figure 3:
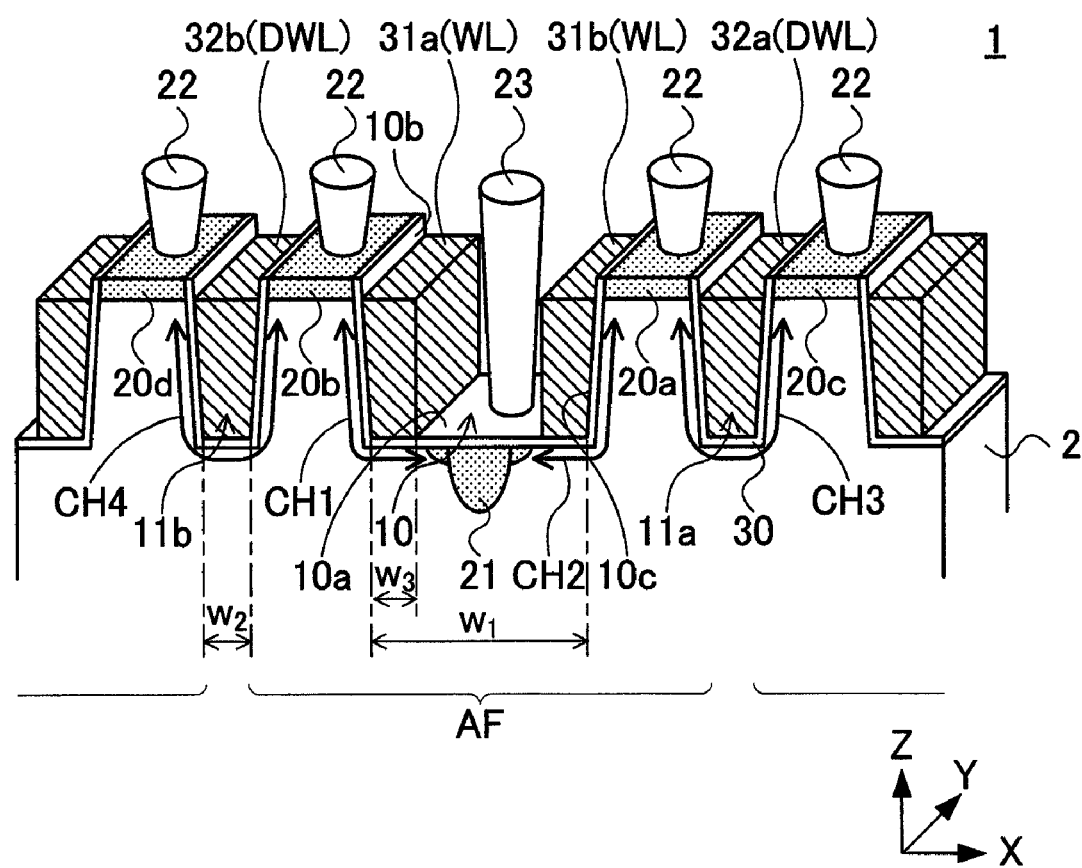
FIG. 3 is a perspective view schematically showing the semiconductor device according to a preferred embodiment of the present invention.

FIG. 3 is a perspective view schematically showing the semiconductor device 1. The diagram roughly shows the configuration of a portion around a cross-sectional surface taken along line A-A' of FIG. 1. As shown in the diagram, the semiconductor device 1 includes a silicon substrate 2, on a surface of which a cell gate trench 10 is provided: the cell gate trench 10 includes a bottom face 10a, a side face 10b (first side face), and a side face 10c (second side face), which faces the side face 10b. Furthermore, on both sides of the cell gate trench 10 in the X-direction, a field-shield gate trench 11, the width of which is narrower than the cell gate trench 10, is provided. The inner surfaces of the trenches 10 and 11 are thermally oxidized, and the thermally-oxidized portions, i.e. silicon oxide films, form a gate insulating film 30.

In the following description, two trenches 11 on both sides of the trench 10 are referred to as trench 11a (first field-shield gate trench) and as trench 11b (second field-shield gate trench), respectively, as shown in FIG. 3. The X-direction widths of the trenches 10 and 11 (11a and 11b) are represented by $w_1$ and $w_2$ ($w_1 > w_2$), respectively.

Since the trenches are formed on the surface of the silicon substrate 2, silicon pillars are formed in areas between the trenches. On the upper ends of the silicon pillars, upper diffusion layers 20 are formed. The STIs 60 are in contact with both Y-direction sidewalls of the silicon pillars. More specifically, on the upper end of a silicon pillar formed between a trench 10 and a trench 11a, a first upper diffusion layer 20a is formed. On the upper end of a silicon pillar formed between a trench 10 and a trench 11b, a second upper diffusion layer 20b is formed. On the upper end of a silicon pillar formed on the opposite side of the trench 11a from the first upper diffusion layer 20a, a third upper diffusion layer 20c is formed. On the upper end of a silicon pillar formed on the opposite side of the trench 11b from the second upper diffusion layer 20b, a fourth upper diffusion layer 20d is formed. On the bottom face 10a of the trench 10, a lower diffusion layer 21 is provided. The first to fourth upper diffusion layers 20a to 20d are each connected to upper-layer cell capacitors (not shown in FIG. 3) via storage node contact plugs 22. The lower diffusion layer 21 is connected to an upper-layer bit line BL (not shown in FIG. 3) via a bit line contact plug 23.

The side faces 10b and 10c of the trench 10 are covered with first and second cell gate electrodes 31a and 31b, respectively, via the gate insulating film 30. Each of the cell gate electrodes 31a and 31b serves as word lines WL. That is, the gate electrodes 31a and 31b are sidewall conducting films formed on the corresponding side faces. The X-direction film thickness $w_3$ of the gate electrodes 31a and 31b are set substantially smaller than the width $w_1$ of the trench 10. Accordingly, there is space between the gate electrodes 31a and 31b, and there is no electrical connection between the gate electrodes 31a and 31b.

Of two cell transistors T1 and T2 assigned to one active field AF (see FIG. 2), the cell transistor T1 includes the gate electrode 31a, the second upper diffusion layer 20b, and the lower diffusion layer 21. The second upper diffusion layer 20b and the lower diffusion layer 21 serve as the source and drain of the cell transistor T1, respectively, or as the drain and source of the cell transistor T1, respectively. Similarly, the cell transistor T2 includes the gate electrode 31b, the first upper diffusion layer 20a, and the lower diffusion layer 21. The first upper diffusion layer 20a and the lower diffusion layer 21 serve as the source and drain of the cell transistor T2, respectively, or as the drain and source of the cell transistor T2, respectively. Accordingly, the cell transistors T1 and T2 work as transistors of a single-side sidewall gate type: the sidewall conducting films, each of which is formed on one side of the trench, make up gate electrodes, while two diffusion layers, which are provided on a one-side face upper end and bottom face of the trench, respectively, make up the source/drain.

In the trenches 11a and 11b, first and second field-shield gate electrodes 32a and 32b, which serve as dummy word lines DWL, are placed via the gate insulating film 30. The width $w_2$ of the trenches 11a and 11b is so set that, when the gate electrodes 31a and 31b and the gate electrodes 32a and 32b are formed at the same time (the formation method is described below in detail), the insides of the trenches 11a and 11b except upper-end portions are completely filled with the gate electrodes 32a and 32b.

Of field-shield transistors F1 and F2 provided on both sides of an active field AF (see FIG. 2), the field-shield transistor F1 includes the gate electrode 32a and the first and third upper diffusion layers 20a and 20c. The first and third upper diffusion layers 20a and 20c serve as the source and drain of the field-shield transistor F1, respectively, or as the drain and source of the field-shield transistor F1, respectively. Similarly, the field-shield transistor F2 includes the gate electrode 32b and the second and fourth upper diffusion layers 20b and 20d. The second and fourth upper diffusion layers 20b and 20d serve as the source and drain of the field-shield transistor F2, respectively, or as the drain and source of the field-shield transistor F2, respectively. Accordingly, the field-shield transistors F1 and F2 are not of a single-side sidewall gate type, but of a so-called trench type: the conducting films placed into the trenches make up gate electrode (dummy word lines DWL), and the two diffusion layers that are each provided on the upper ends of both side faces of a trench make up the source/drain. However, as described above, a voltage is applied to a dummy word lines DWL in a way that does not form a channel on a surface of the silicon substrate facing the dummy word line DWL across the gate insulating film 30. Therefore, the field-shield transistors F1 and F2 do not function as transistors. The field-shield transistor F1 and F2 function as element isolations between the active fields AF that are adjacent to each other in the X-direction.

FIG. 3 shows channels CH1 to CH4 of each transistor. The channels CH1 and CH2 corresponding to the cell transistors T1 and T2 are formed on a surface of the silicon substrate that faces the gate electrodes 31a and 31b across the gate insulating film 30 after a predetermined voltage greater than or equal to a threshold voltage is controlled and applied to the gate electrodes 31a and 31b. Meanwhile, as described above, a voltage less than the threshold voltage of the field-shield transistors F1 and F2 is constantly applied to the dummy word lines DWL (gate electrodes 32a and 33a). Accordingly, no channel is formed at the positions of the channels CH3 and CH4 of the field-shield transistors F1 and F2, resulting in no flow of current.

It is clear from FIG. 3 that the length of the channels CH3 and CH4 (=the gate length of the field-shield transistors F1 and F2) is nearly twice the length of the channels CH1 and CH2 (=the gate length of the cell transistors T1 and T2). Since the channels CH3 and CH4 have been made longer in such a manner, the possibility is reduced that in the semiconductor device 1, current flows to the channels CH3 and CH4, when compared with the related art by which a transistor of a single-side sidewall gate type is also used for a field-shield transistor. Therefore, the element isolation function of the field-shield transistors has been enhanced.

Moreover, according to the semiconductor device 1, it is possible to reduce the occurrence of so-called "disturb fault," which will be described below in detail.

Figure 4A:
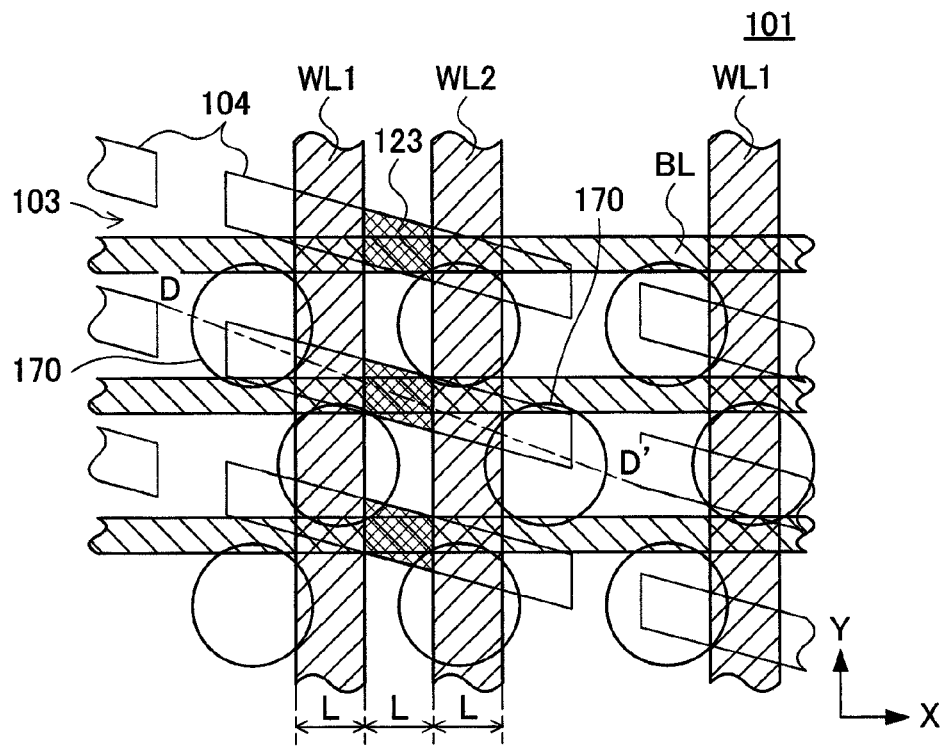
FIG. 4A is a two-dimensional diagram of a semiconductor device of the related art.
Figure 4B:
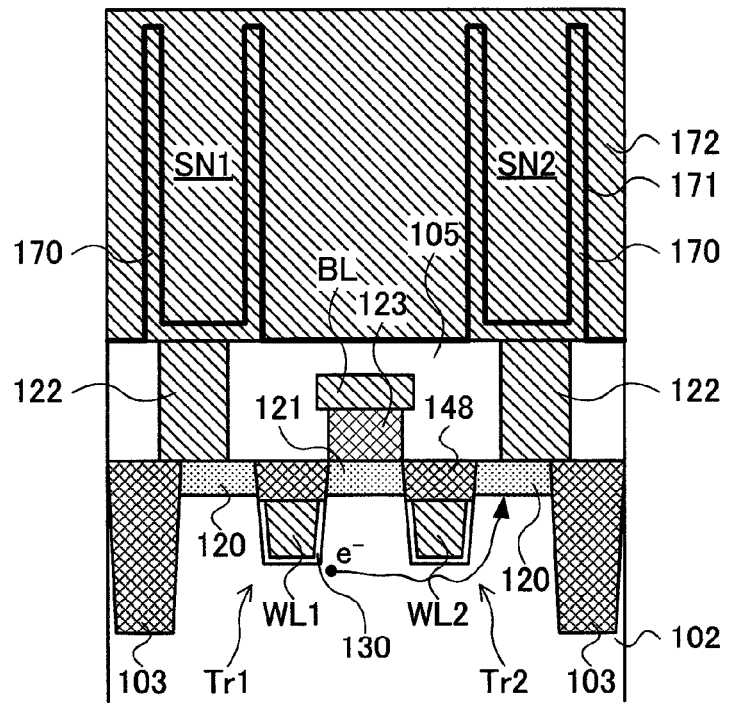
FIG. 4B is a cross-sectional view of the semiconductor device taken along line D-D' of FIG. 4A.

First, with reference to a semiconductor device of the related art, the following describes what "disturb fault" is. FIG. 4A is a two-dimensional diagram of a semiconductor device 101 of the related art. FIG. 4B is a cross-sectional view of the semiconductor device 101 taken along line D-D' of FIG. 4A. As shown in the diagrams, the semiconductor device 101 includes a semiconductor substrate 102, on a surface of which element isolation regions 103 are provided, with an insulating film embedded in the element isolation regions 103. With the element isolation regions 103, a plurality of active fields 104 is mapped out in a matrix pattern.

The semiconductor device 101 includes bit lines BL, which extend in an X-direction, and word lines WL1 and WL2, which extend in a Y-direction. The two adjacent word lines WL1 and WL2 and one bit line BL cross one active field 104. As shown in FIG. 4B, the word lines WL1 and WL2 are formed so as to be placed in the trenches extending in the Y-direction via gate insulating films 130. The top surfaces of the word lines WL1 and WL2 are covered with insulating films 148.

In a region between a word line WL1 and an adjoining element insulation region 103, a diffusion layer 120 is provided. Similarly, between a word line WL2 and an adjoining element isolation region 103, a diffusion layer 120 is provided. In a region between a word line WL1 and a word line WL2, a diffusion layer 121 is provided. With the above configuration, the following two transistors are formed: a cell transistor Tr1, in which a word line WL1 serves as a gate electrode and the diffusion layers 120 and 121 on both sides thereof serve as a source/drain; and a cell transistor Tr2, in which a word line WL2 serves as a gate electrode and the diffusion layers 120 and 121 on both sides thereof serve as a source/drain. The diffusion layer 121 is shared by the two cell transistors Tr1 and Tr2.

On a surface of the semiconductor substrate 102, an interlayer insulating film 105 is formed. The bit line BL is formed so as to be embedded in the interlayer insulating film 105. The bit line BL runs above the diffusion layer 121. The bit line BL and the diffusion layer 121 are electrically connected by a bit line contact plug 123 formed inside the interlayer insulating film 105. On the top surface of the interlayer insulating film 105, lower electrodes 170 of cell capacitors are each formed at positions corresponding to the diffusion layers 120. The top surfaces and side surfaces of the lower electrodes 170 are covered with a capacitance insulating film 171, on a top surface of which an upper electrode 172 is formed. The components described above form a cell capacitor SN1 at a position corresponding to the diffusion layer 120 of the cell transistor Tr1, and a cell capacitor SN2 at a position corresponding to the diffusion layer 120 of the cell transistor Tr2. The diffusion layers 120 and the corresponding lower electrodes 170 are electrically connected by storage node contact plugs 122 that pass through the interlayer insulating film 105.

In the semiconductor device 101 having the above configuration, if the word line WL1 is turned on to form a channel of the cell transistor Tr1, for example, and a low-level potential is applied to the corresponding bit line BL, data "0" corresponding to the low-level is stored in the cell capacitor SN1. Moreover, if the word line WL2 is turned on to form a channel of the cell transistor Tr2 is formed at a time, for example, and a high-level potential is applied to the corresponding bit line BL, data "1" corresponding to the high-level is stored in the cell capacitor SN2.

Suppose that, when data "0" is stored in the cell capacitor SN1 and data "1" in the cell capacitor SN2, the word line WL1 are repeatedly turned on and off. The operation is equivalent to the operating of other cell transistors that use the word line WL1. The on-off operation induces an electron $e^-$ in the channel of the cell transistor Tr1. However, as shown in FIG. 4B, the electron $e^-$ could reach the diffusion layer 120 of the cell transistor Tr2 and change the data stored in the cell capacitor SN2 from "1" to "0." That is, the data stored in the cell capacitor SN2 could be destroyed. The event described above is what is called "disturb fault." That is, a "disturb fault" means destroying the storage state of another memory cell due to the operational state of one of the adjacent memory cells.

It is necessary to reduce the occurrence frequency of the "disturb fault" because the "disturb fault" can lead to a decline in the reliability of the semiconductor device. In the semiconductor device 101 shown in FIGS. 4A and 4B, the occurrence frequency of the "disturb fault" tends to increase as the distance between the word line WL1 and the diffusion layer 120 of the cell transistor Tr2 (or the distance between the word line WL2 and the diffusion layer 120 of the cell transistor Tr1) decreases. The distance is determined based on a minimum processing size of a process. For example, in a process by which the width L of a space between a word line WL1 and a word line WL2 turns out to be 70 nm (Minimum processing size=70 nm), the occurrence frequency of the "disturb fault" is substantially small, causing almost no problems. More specifically, one disturb fault occurs every 10,000 on-off operations of the word line WL1. However, now that the size of transistors become even smaller and the width L of a space between a word line WL1 and a word line WL2 is less than or equal to 50 nm (Minimum processing size≦50 nm), the "disturb fault" occurs more frequently, posing problems.

In the semiconductor device 1 of the present embodiment shown in FIG. 3, there is the lower diffusion layer 21 between the word line WL (which is for example the cell gate electrode 31a) of one cell transistor and the upper diffusion layer (which is for example the upper diffusion layer 20a) of the other cell transistor. The lower diffusion layer 21 blocks electrons from moving from an area near the word line WL of one cell transistor to the upper diffusion layer of the other cell transistor. Therefore, when compared with the semiconductor device 101 of the related art, the semiconductor device 1 of the present embodiment can reduce the occurrence of "disturb fault."

The following describes another configuration of the semiconductor device 1 with reference to cross-sectional views of the semiconductor device 1.

Figure 5:
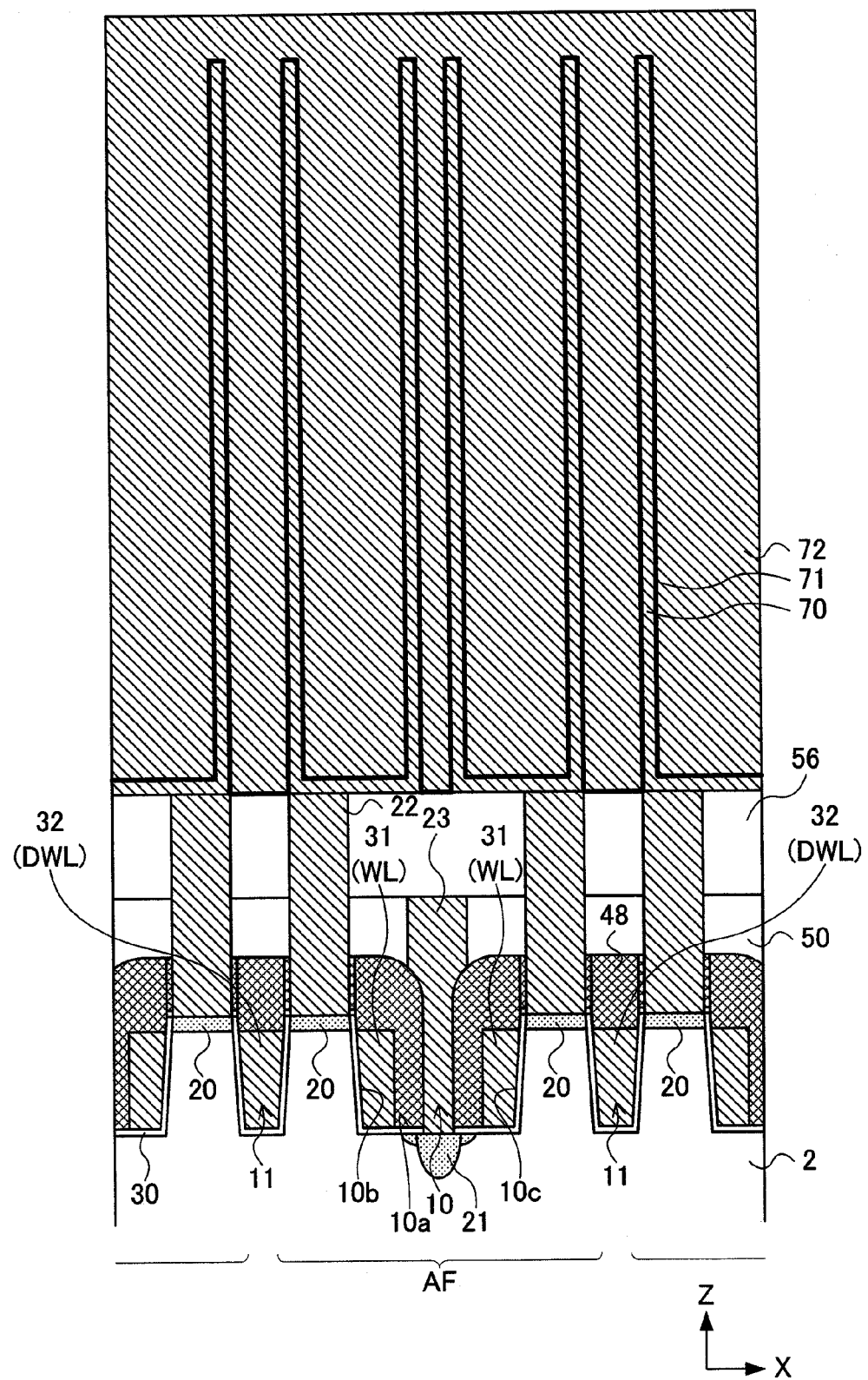
FIG. 5 is a cross-sectional view of the semiconductor device taken along line A-A' of FIG. 1.
Figure 6A:
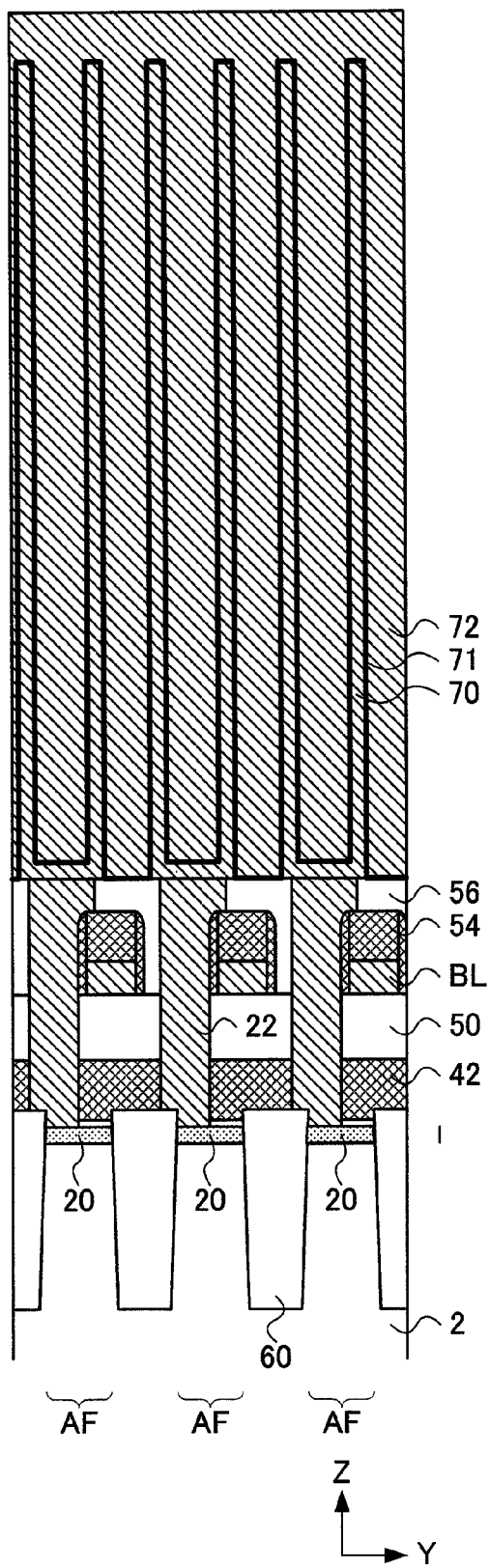
FIG. 6A is a cross-sectional view of the semiconductor device taken along line B-B' of FIG. 1.
Figure 6B:
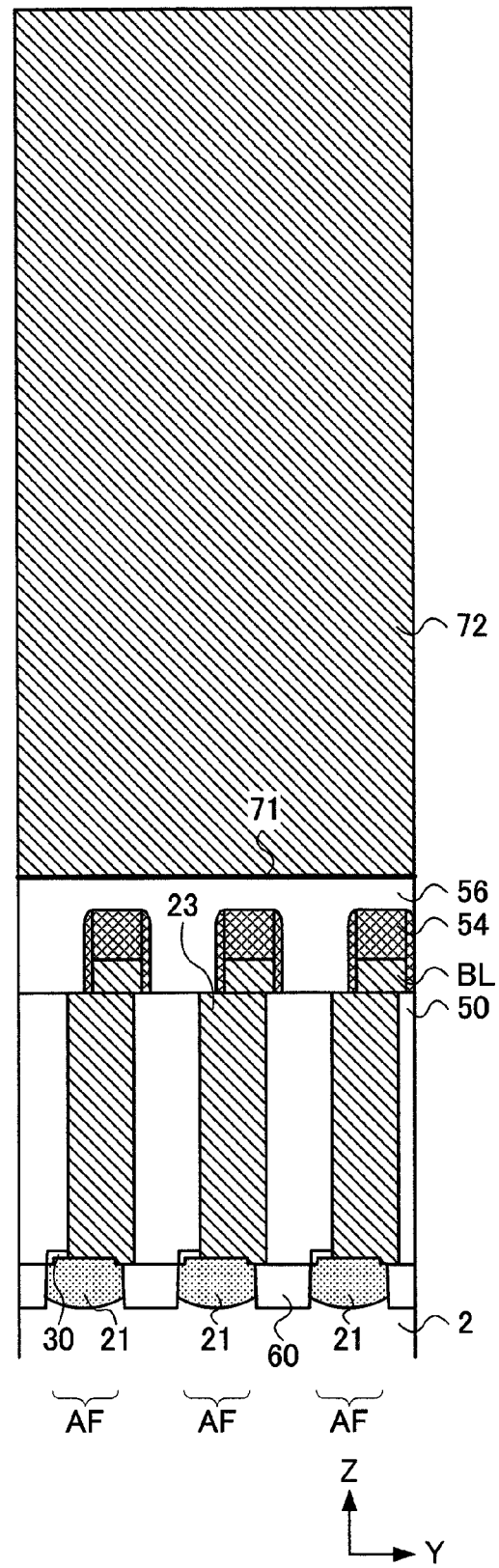
FIG. 6B is a cross-sectional view of the semiconductor device taken along line C-C' of FIG. 1.

FIG. 5 is a cross-sectional view of the semiconductor device 1 taken along line A-A' of FIG. 1. FIG. 6A is a cross-sectional view of the semiconductor device 1 taken along line B-B' of FIG. 1. FIG. 6B is a cross-sectional view of the semiconductor device 1 taken along line C-C' of FIG. 1. As shown in the diagrams, active fields AF are mapped out in an X-direction by field-shield transistors, the gate electrodes of which are dummy word lines DWL placed in trenches 11, while being mapped out in a Y-direction by STIs 60.

A cell capacitor includes a lower electrode 70, a capacitance insulating film 71, and an upper electrode 72, as shown in FIGS. 5 and 6A. The two cell capacitors that correspond to one active field AF are disposed side by side in an X-direction in a region almost right above the corresponding two cell transistors. The lower electrodes 70 of the cell capacitors are connected by a storage node contact plug 22 to an upper diffusion layer 20 between trenches 10 and 11.

A bit line BL is provided in a region sandwiched between a cell capacitor and a cell transistor as shown in FIGS. 6A and 6B and is connected by a bit line contact plug 23 to a lower diffusion layer 21 provided on a bottom face 10a of a trench 10. A portion of the bit line contact plug 23 is provided in a region between gate electrodes 31a and 31b in the trench 10. As shown in FIG. 6B, a lower diffusion layer 21 is divided by STIs 60 in a Y-direction; the lower diffusion layers 21, which are formed between the active fields that are adjacent to each other in the Y-direction, do not connect to each other.

A bit line BL is not placed right above the corresponding lower diffusion layer 21 but at a position offset in the Y-direction by about half the Y-direction length of the bit line BL. Therefore, both the connection of the bit line BL to the lower diffusion layer 21 through the bit line contact plug 23, and the connection of the lower electrode 70 to the upper diffusion layer 20 through the storage node contact plug 22 can be realized without bending the bit line BL.

The following describes a method of manufacturing the semiconductor device 1 of the present embodiment with reference to FIGS. 7A to 25C; FIGS. 7A to 25A are cross-sectional views of the semiconductor device 1 corresponding to FIG. 5, respectively. FIGS. 7B to 25B are cross-sectional views of the semiconductor device 1 corresponding to FIG. 6A, respectively. FIGS. 7C to 25C are cross-sectional views of the semiconductor device 1 corresponding to FIG. 6B, respectively.

As shown in FIGS. 7A to 7C, what is first prepared is a silicon substrate 2, on a surface of which STIs 60 are formed. The STIs 60 are formed as trenches are provided on the surface of the silicon substrate 2 and an insulating film, such as a silicon oxide film, is placed (embedded) into the trenches. The STIs 60 extend in the X-direction as shown in FIG. 1, thereby mapping out active fields in the Y-direction. The active fields make up belt-like active fields (the belt-like active fields BF shown in FIG. 1) extending in the X-direction. After the STIs 60 are formed, a cap insulating film 42 is formed across the entire surface of the silicon substrate 2: in the cap insulating film 42, a silicon oxide film 40, which serves as a protective insulating film, and a silicon nitride film 41, which serves as a hard mask, are stacked. The way the cap insulating film 42 is formed is not limited to a specific method. The silicon oxide film 40 and the silicon nitride film 41 may be formed by a CVD (Chemical Vapor Deposition) method. It is preferred that the silicon oxide film 40 be about 5 nm in thickness and the silicon nitride film 41 about 120 nm in thickness.

Figure 8A:
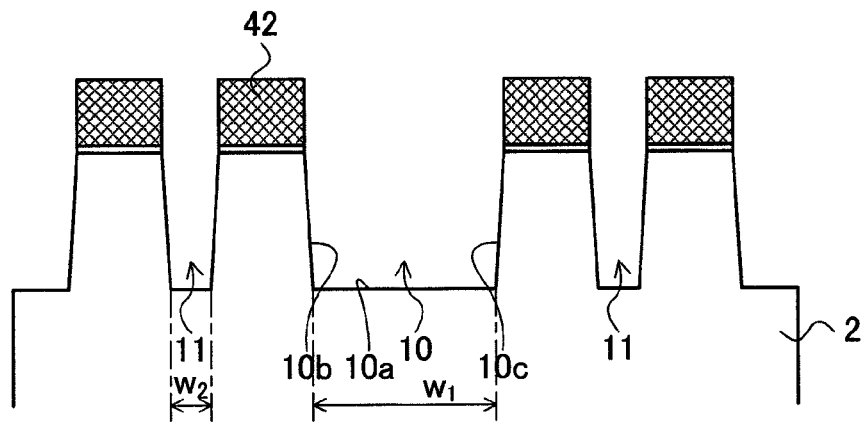
Figure 8B:
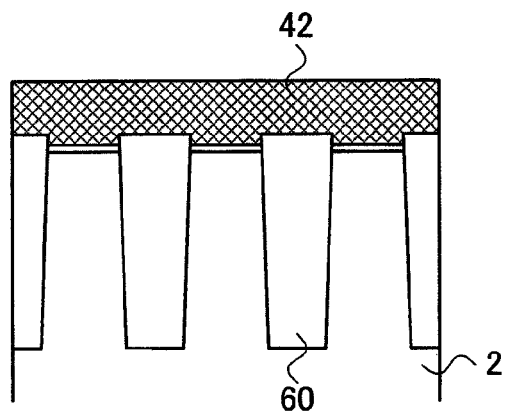
Figure 8C:
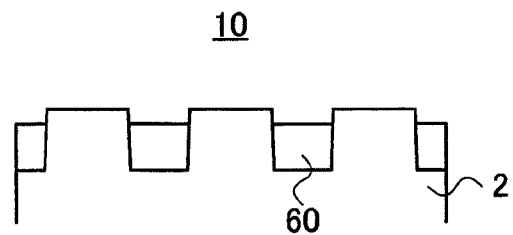

Then, the patterning of the cap insulating film 42 takes place with the use of a mask pattern that extends in the Y-direction, which is perpendicular to the X-direction. Moreover, the patterned cap insulating film 42 is used as a mask, and the etching of the exposed surfaces of the silicon substrate 2 and STIs 60 takes place, thereby forming trenches 10 and 11 that extend in the Y-direction as shown in FIGS. 8A to 8C. The X-direction width $w_2$ of the trenches 11 is set to a minimum processing size, which is determined by a process. The X-direction width $w_1$ of the trench 10 is set so as to be greater than or equal to three-halves of $w_2$. For example, if the process is configured so that the minimum processing size is 40 nm, it is preferred that $w_1$ and $w_2$ be about 80 nm and 40 nm, respectively. Incidentally, in the etching, if an etching condition under which an etching rate of the silicon substrate is equivalent to an etching rate of the silicon oxide film is used, each portion can be etched at the same time. When the etching rates are not set to the same rate, the etching of the silicon substrate and the etching of the silicon oxide film may take place separately so as to have the same depth.

Figure 9A:
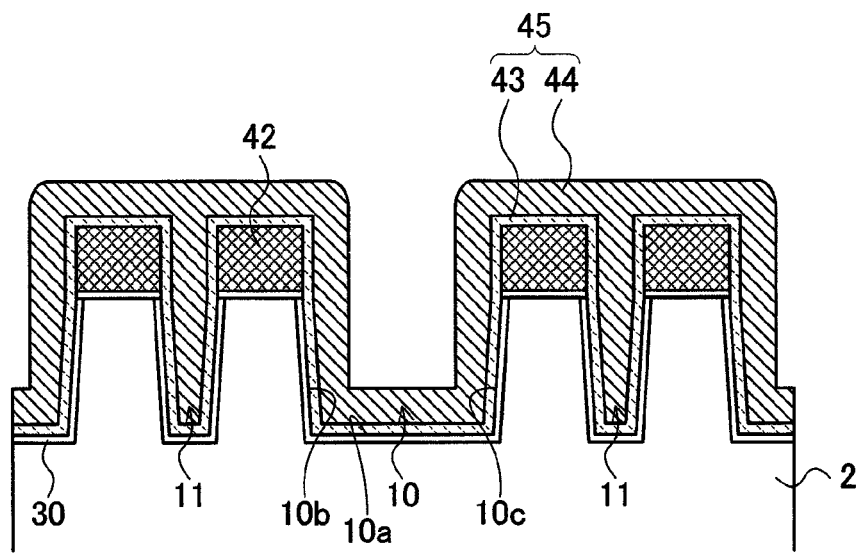
Figure 9B:
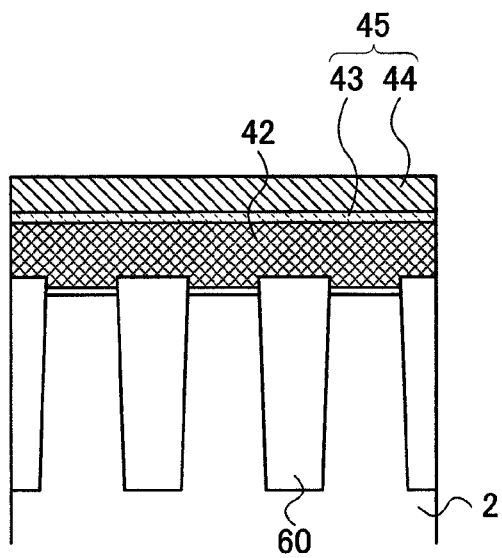
Figure 9C:
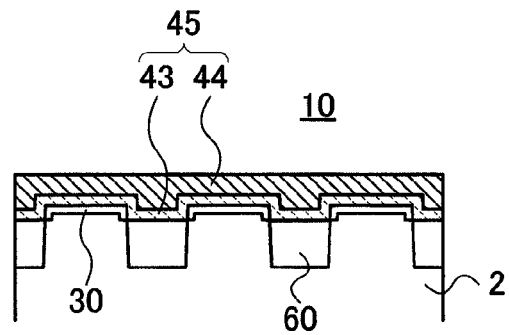

After an appropriate amount of impurities (not shown) is introduced into the surface of the silicon substrate 2 for control of a MOS transistor characteristic, the internal surfaces of the trenches 10 and 11 are thermally oxidized to form a gate insulating film 30 as shown in FIGS. 9A to 9C. Then, polysilicon 43 and a metal film 44, such as tungsten, are sequentially formed across the entire surface. Therefore, a laminated film 45 (word-line material), which later becomes gate electrodes 31 and 32, is formed. The word-line material is not limited to the above laminated film; a laminated film of titanium nitride and tungsten, a single-layer film of titanium nitride, or the like may be used. Since the above films are made of metal films, there is the effect of lowering the resistance of word lines WL, making contributions to the high-speed operation of the semiconductor device.

Figure 10A:
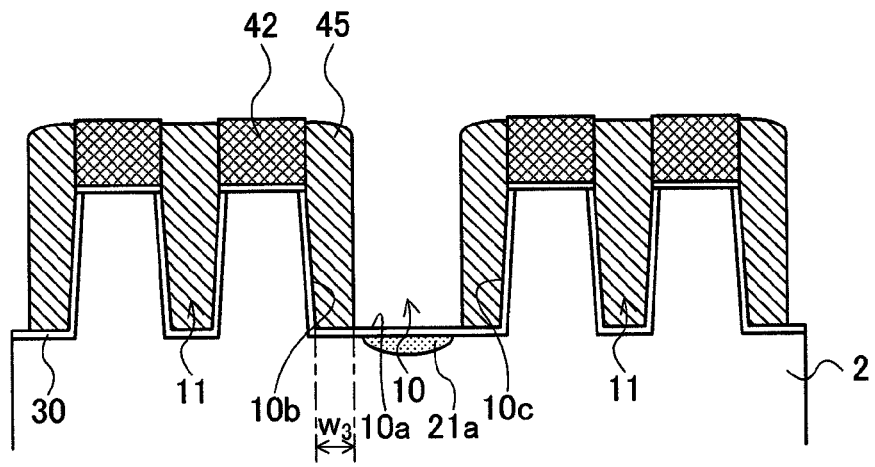
Figure 10B:
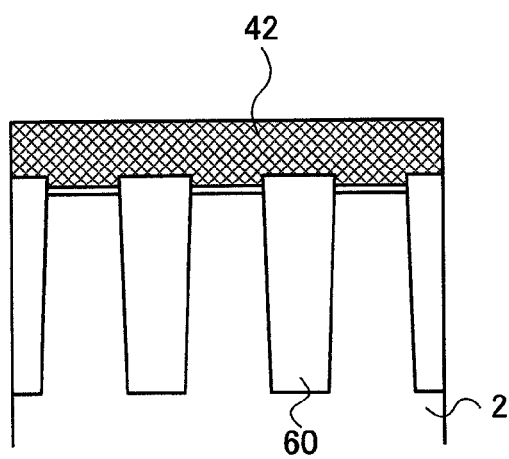
Figure 10C:
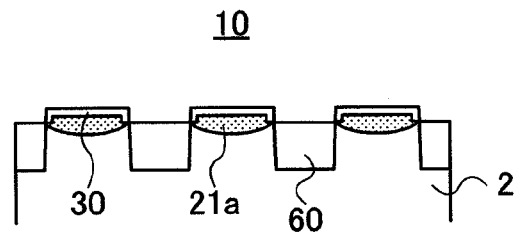

In this case, it is preferred that the film formation amount of the laminated films 45 be set so as to be the situation shown in the subsequent FIGS. 10A to 10C (the state after an anisotropic etch-back), in which the X-direction width $w_3$ is about one-quarter of the width $w_1$ of the trench 10. Therefore, the laminated films 45 formed on the side faces 10b and 10c of the trenches 10 do not make direct contact with each other. Moreover, in order to appropriately form a bit line contact plug 23, the film formation amount of the laminated films 45 needs to be set as described above. The film formation amount will be described later in detail.

Then, an anisotropic etch-back takes place to remove the laminated film 45 stacked on a flat portion. Therefore, as shown in FIGS. 10A to 10C, the laminated film 45 formed on the bottom face 10a of the trench 10 is removed, and the laminated films 45 formed on the side faces 10b and 10c of the trench 10 are electrically separated from each other. Meanwhile, the laminated films 45 remain placed inside the trenches 11. Incidentally, in FIGS. 10A to 10C and the subsequent drawings, the laminated film 45 is depicted as a single film in order to make the drawings easy to understand.

After the laminated film 45 is removed by the anisotropic etch-back, an ion implantation method is used to implant a relatively low level of impurity ions in the bottom face 10a of the trench 10. As a result, as shown in FIGS. 10A and 10C, a low-level diffusion layer 21a is formed on the bottom face 10a of the trench 10.

Figure 11A:
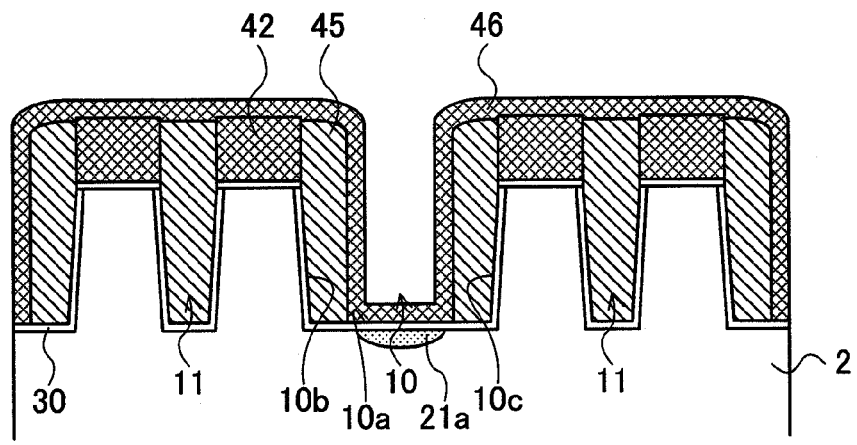
Figure 11B:
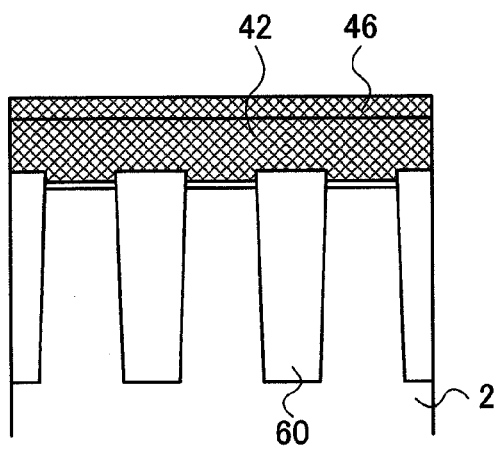
Figure 11C:
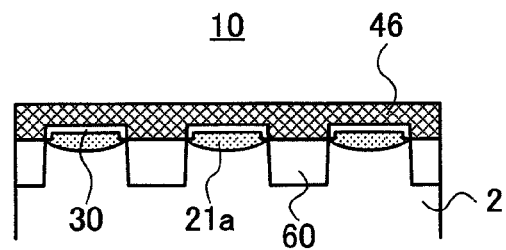
Figure 12A:
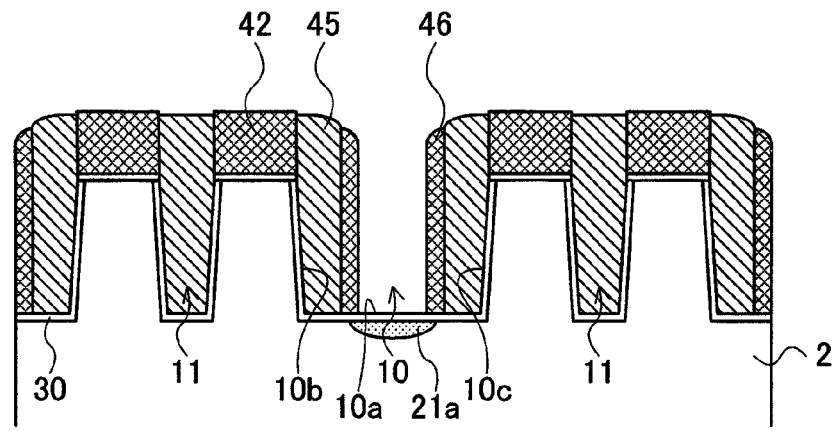
Figures 12B, 12C:
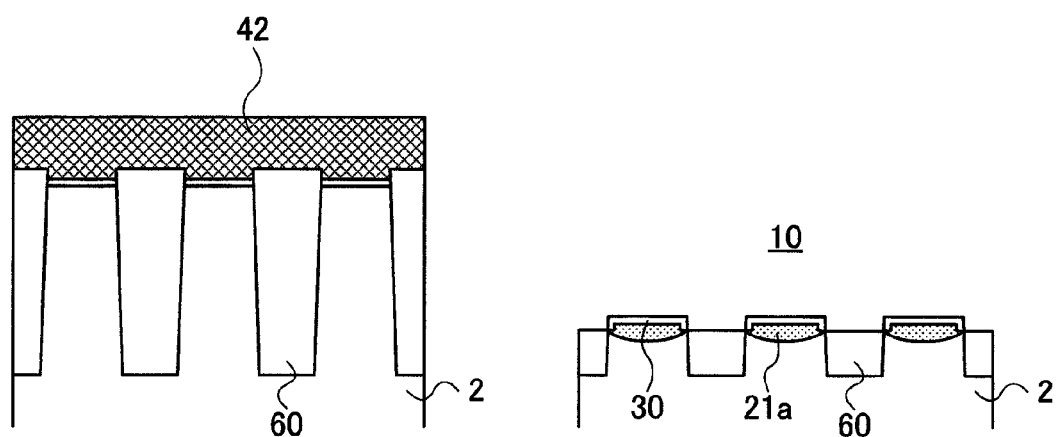
Figure 13A:
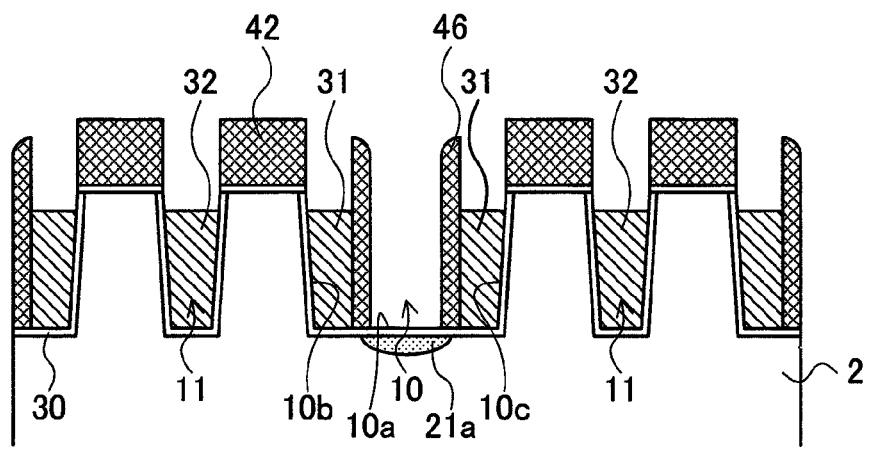
Figure 13B:
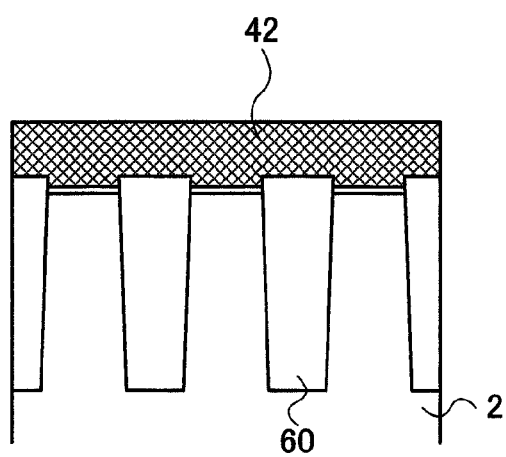
Figure 13C:
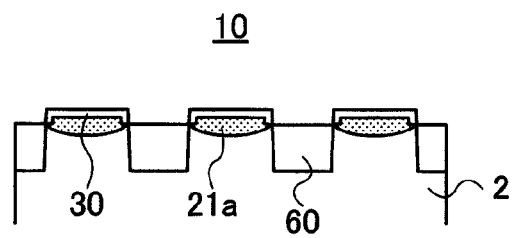

Then, as shown in FIGS. 11A to 11C, a silicon nitride film 46 is formed across the entire surface of the silicon substrate 2. The silicon nitride film 46 is then removed from a flat portion by anisotropic etch-back. As a result, as shown in FIGS. 12A to 12C, the silicon nitride film 46 remains only on the sidewalls of the laminated films 45. After that, an etch-back takes place only on the laminated film 45 in order to lower the top surfaces of the laminated films 45. As a result, as shown in FIGS. 13A to 13C, cell gate electrodes 31 and field-shield gate electrodes 32 are formed in the trenches 10 and 11, respectively. Incidentally, the etch-back of the laminated film 45 is performed so that the top surfaces of the cell gate electrodes 31 are positioned lower than, at least, the top surface of the silicon substrate as well as being positioned at the same level as the bottom face of a top diffusion layer 20, which is formed later. The etch-back of the laminated films 45 may be performed after a resist or the like is placed into the trenches 10; it is therefore possible to prevent the low-level diffusion layer 21a formed on the bottom face 10a from being etched.

Figure 14A:
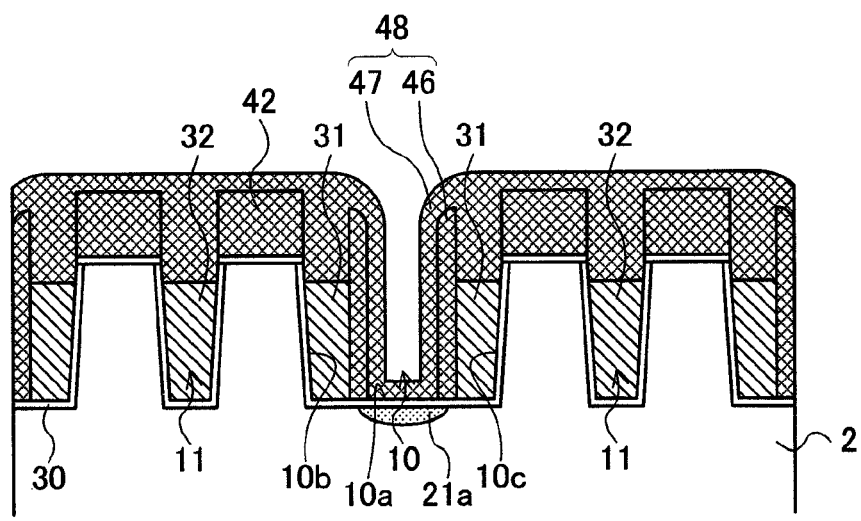
Figure 14B:
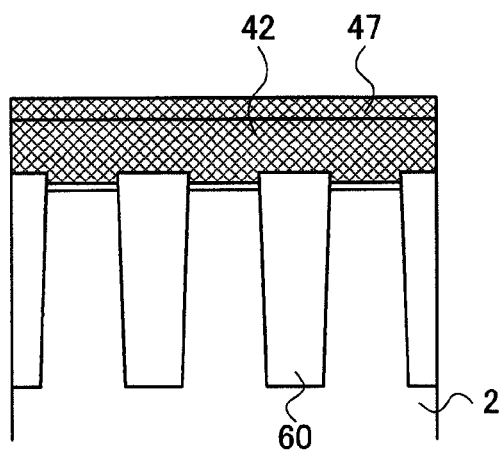
Figure 14C:
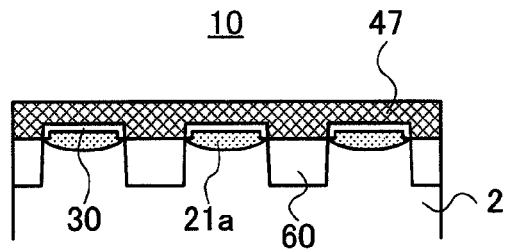

Then, as shown in FIGS. 14A to 14C, a silicon nitride film 47 is formed. The silicon nitride film 47 has a thickness that enables the grooves formed on the tops of the gate electrodes 31 and 32 to be completely filled while preventing the trench 10 from being completely filled with the silicon nitride film 47. The reason the thickness of the silicon nitride film 47 is set as described above is to allow, when a trench 49 is formed in the subsequent process, the bottom face 10a of the trench 10 to be appropriately exposed to the bottom face of the trench 49. Incidentally, the width of a space in the trench 10 is sufficiently wider than the width of the grooves formed on the tops of the gate electrodes 31 and 32, allowing the thickness of the silicon nitride film 47 to be set as described above. The reason the thickness of the silicon nitride film 47 can be set as described above is that the film formation amount of the laminated film 45 is so set that the width $w_3$ of the laminated film 45 after the anisotropic etch-back is about one-quarter of the width $w_1$ of the trench 10 as described above.

Figure 15A:
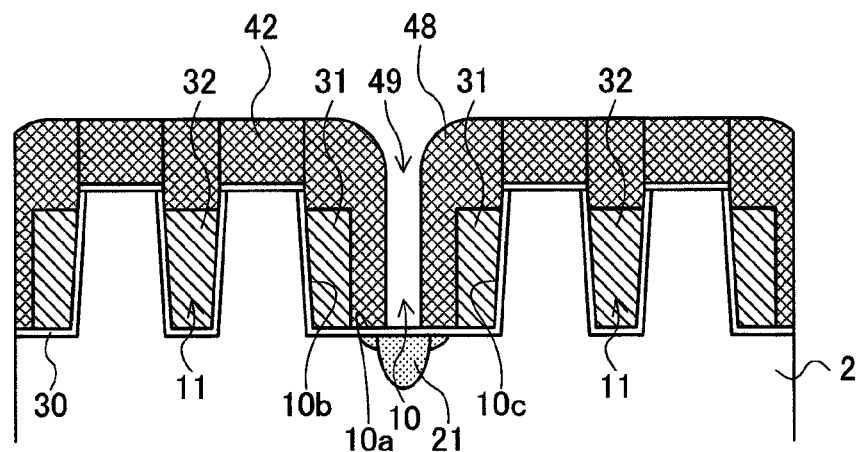
Figure 15B:
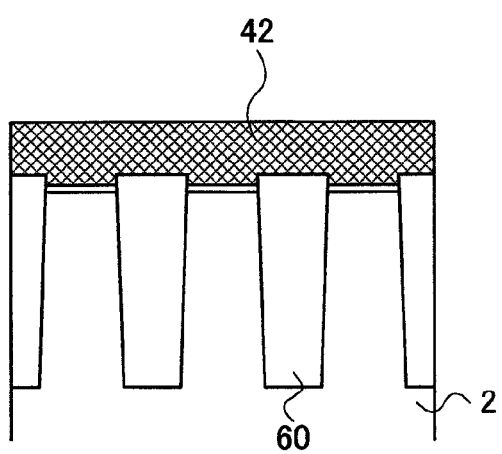
Figure 15C:
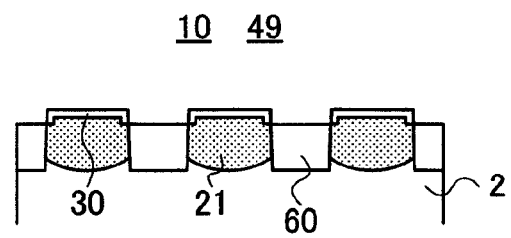
Figure 16A:
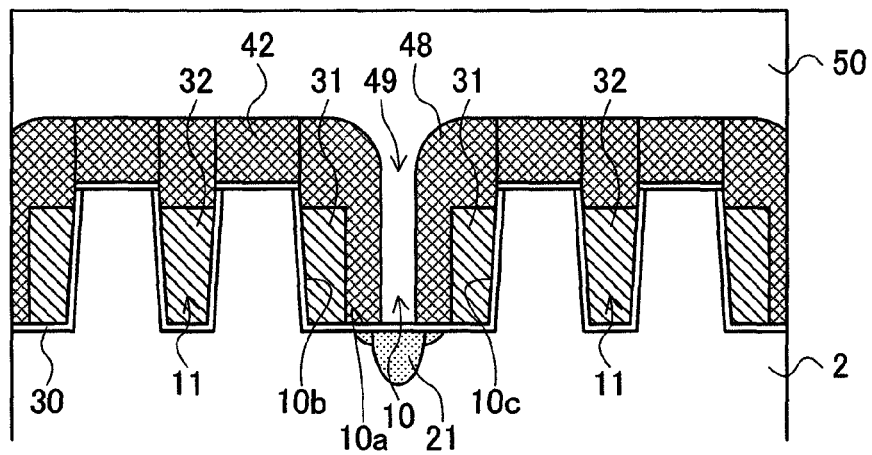
Figure 16B:
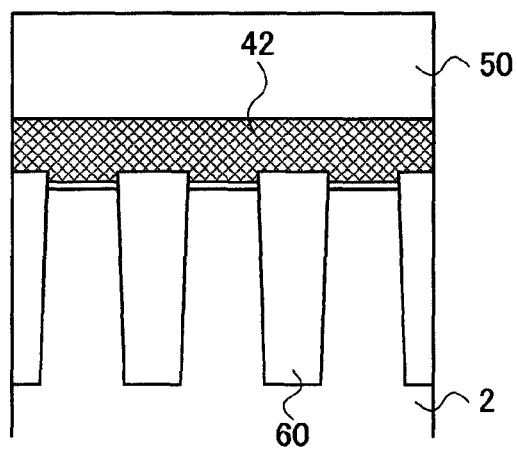
Figure 16C:
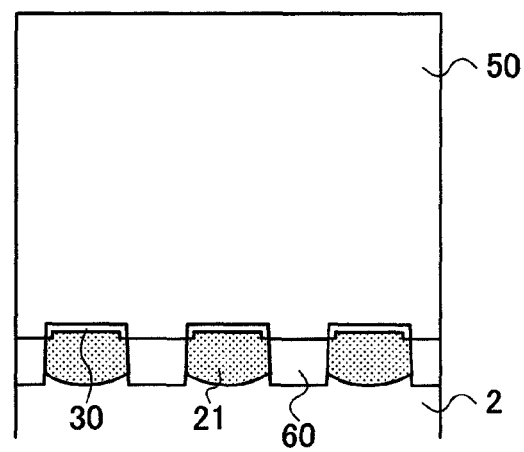

Then, the etch-back of a silicon nitride film 48 (first silicon nitride film) consisting of silicon nitride films 46 and 47 takes place to form the trench 49 (a trench for forming a lower diffusion layer) at the center of the trench 10. To the bottom face of the trench 49, as described above, the bottom face 10a of the trench 10 is exposed. An ion implantation method is used to implant a relatively high level of impurity ions in the exposed bottom face 10a of the trench 10. Therefore, as shown in FIGS. 15A and 15C, the lower diffusion layer 21 is formed on the bottom face 10a of the trench 10. After that, as shown in FIGS. 16A to 16C, a silicon oxide film 50 (first silicon oxide film) is formed so as to have a thickness that enables the trench 49 to be completely filled and the entire area of the silicon nitride film 48 to be covered. It is preferred that the surface of the silicon oxide film 50 be flattened by a CMP (Chemical Mechanical Polishing) method.

Figure 17A:
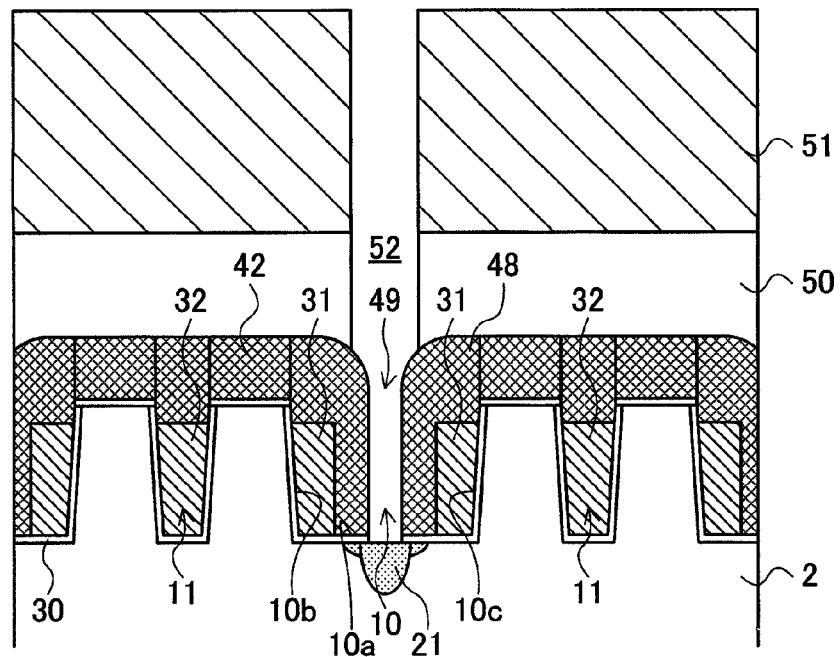
Figures 17B, 17C:
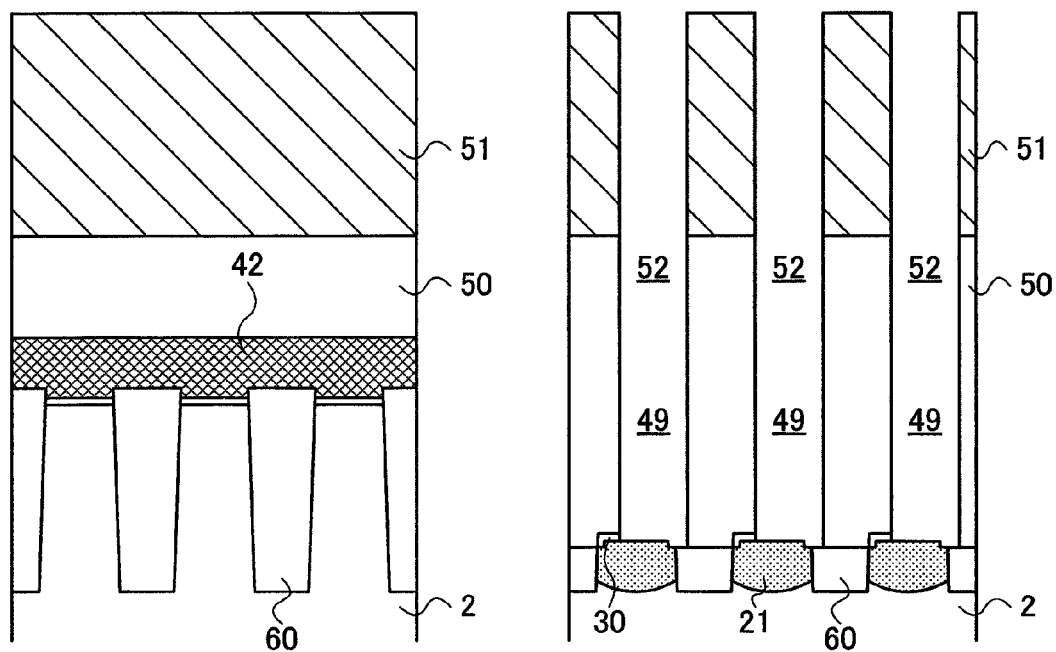

Then, a resist 51 is applied to a surface of the silicon oxide film 50, and a lithographic technique is used to form a resist pattern having an opening in an area where a bit line contact plug 23 is formed. Then, the silicon oxide film 50 and the gate insulating film 30 are etched using the resist pattern to expose the lower diffusion layer 21. As a result, as shown in FIGS. 17A to 17C, a contact hole 52 (first contact hole) is formed in order to form a bit line contact plug 23. Incidentally, for the etching used to form the contact hole 52, a highly selective etching with a sufficiently small etching rate of the silicon nitride film relative to the etching rate of the silicon oxide film is used. Therefore, a lower portion of the contact hole 52 is formed along the X-direction wall surfaces of the trench 49 in a self-aligned manner.

Figure 18A:
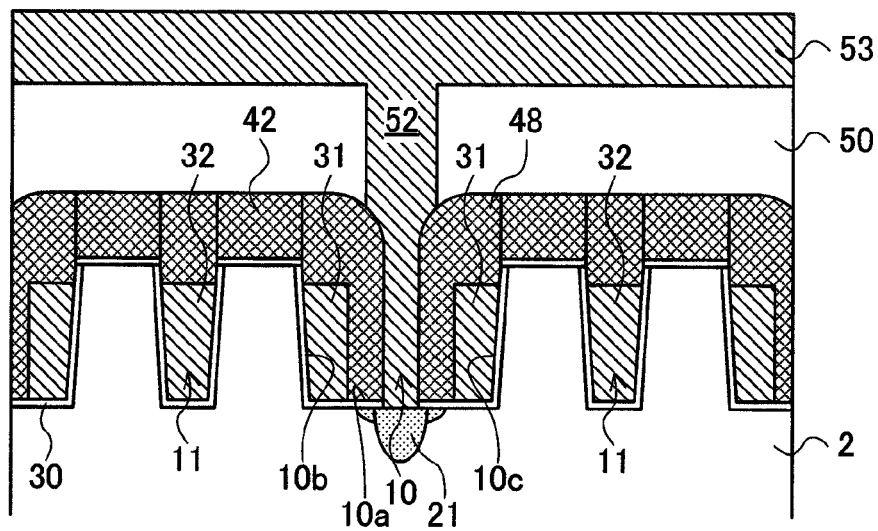
Figure 18B:
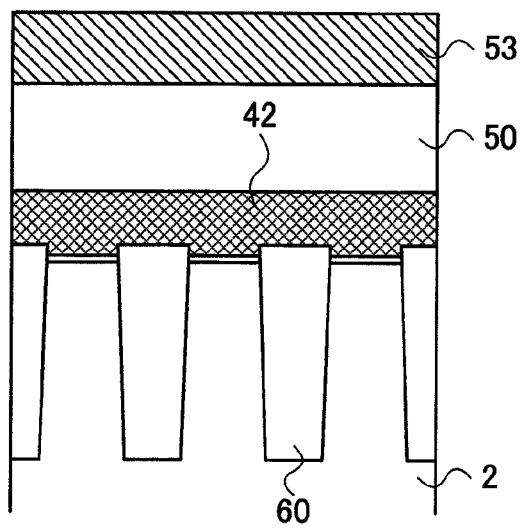
Figure 18C:
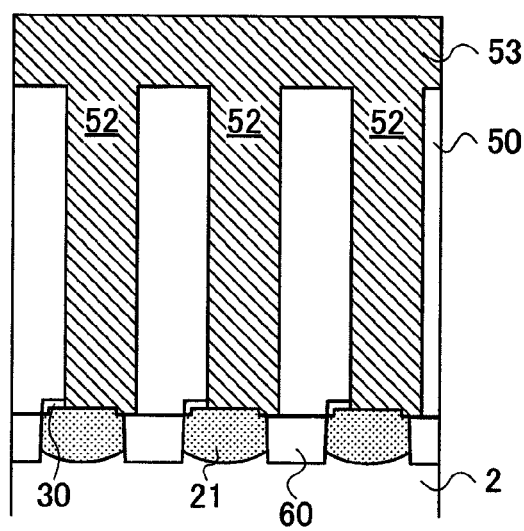
Figure 19A:
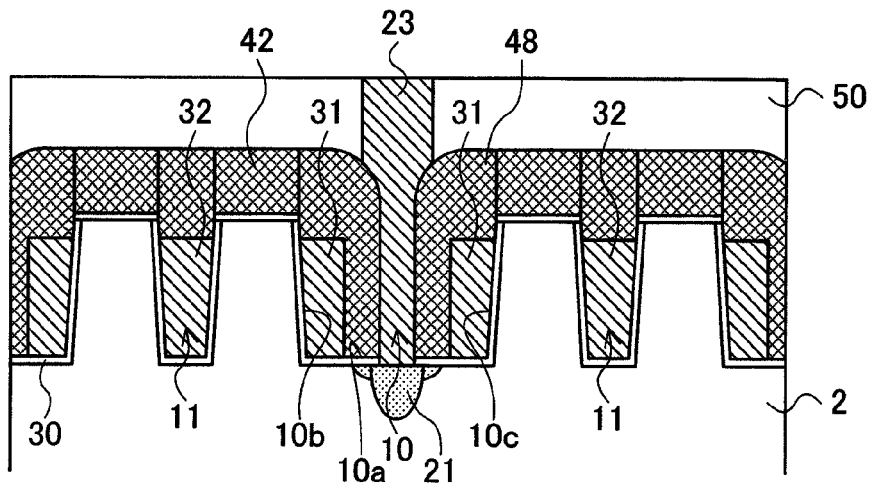
Figure 19B:
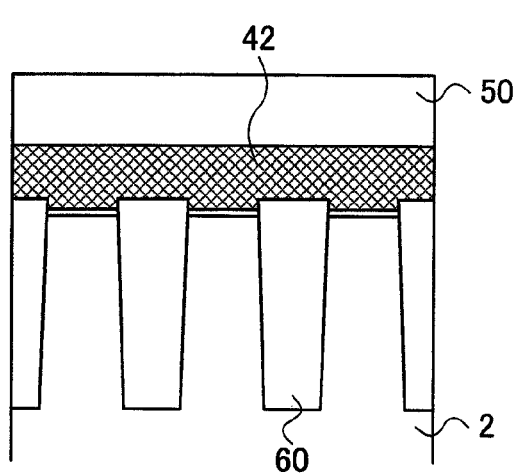
Figure 19C:
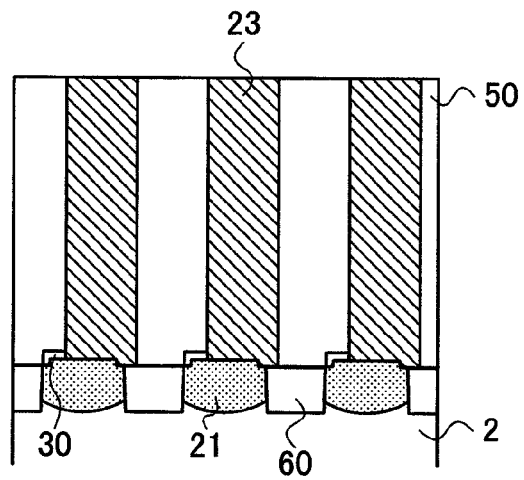

Then, the resist 51 is removed; as shown in FIGS. 18A to 18C, a conducting film 53 is formed so as to have a thickness that enables the inside of the contact hole 52 to be completely filled. More specifically, the following film may be used as a material of the conducting film 53: a single-layer or laminated film made of a metal silicide film, such as cobalt silicide, or a metal film, such as titanium nitride or tungsten. Then, the conducting film 53 is removed from a flat portion by a CMP method, and the bit line contact plug 23 is formed as shown in FIGS. 19A to 19C.

Figure 20A:
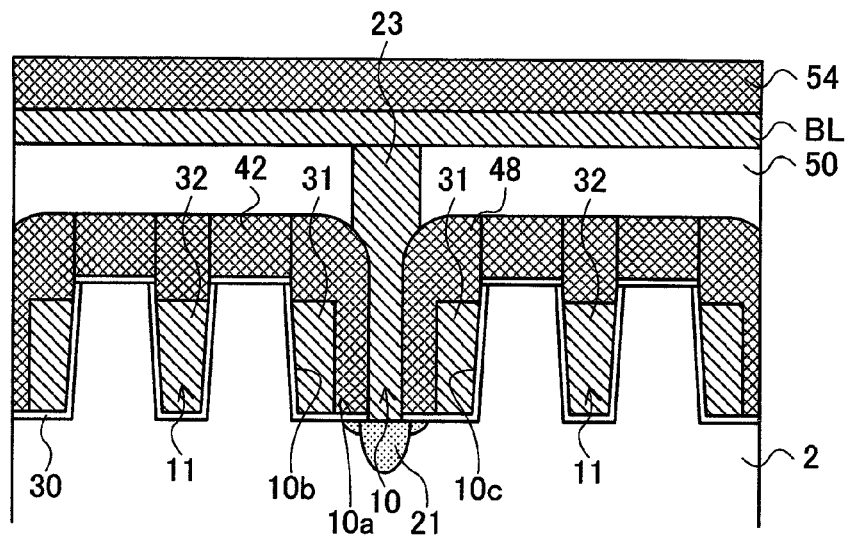
Figure 20B:
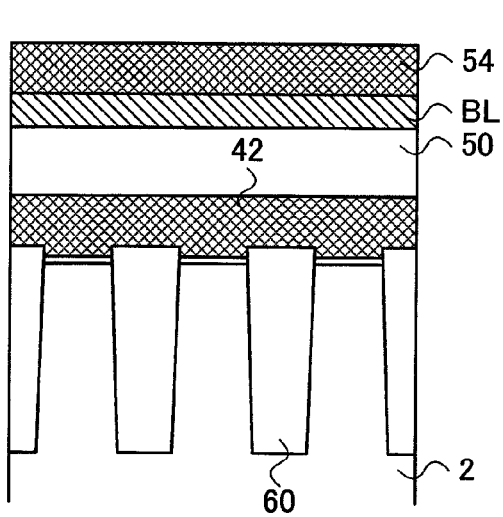
Figure 20C:
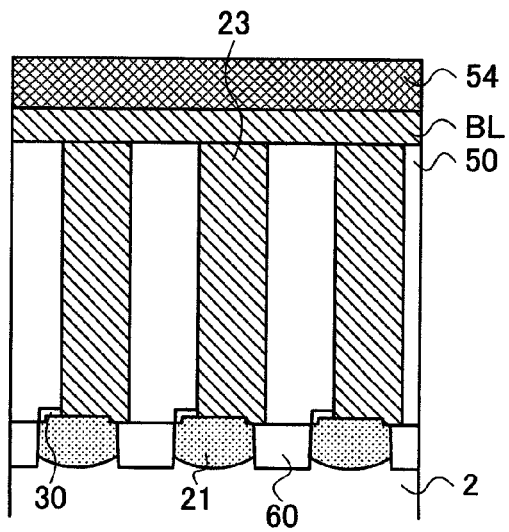
Figure 21A:
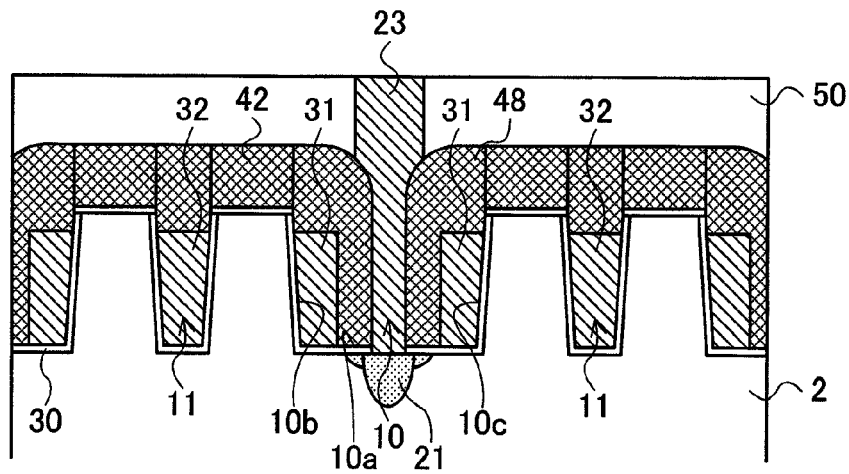
Figure 21B:
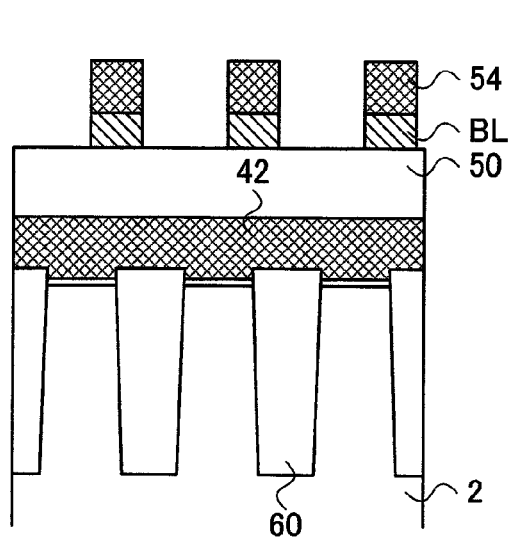
Figure 21C:
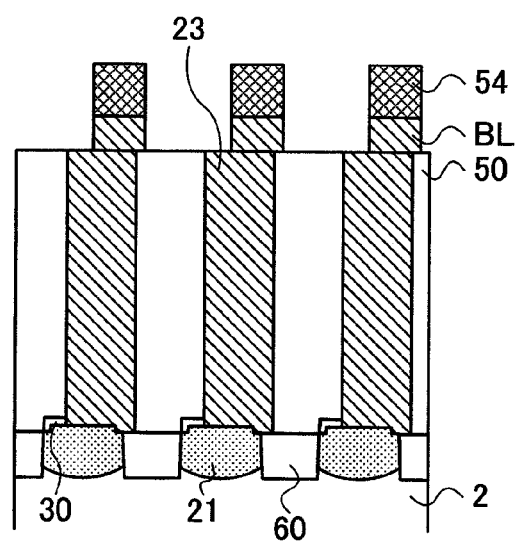

Then, as shown in FIGS. 20A to 20C, on the top surface of the silicon oxide film 50, a conducting film, which serves as a material of a bit line BL, and a silicon nitride film 54 are sequentially formed. More specifically, it is preferred that a laminated film consisting of tungsten and titanium nitride films be used as a material of a bit line BL. A lithographic technique is then used to carry out patterning so that the material of the bit line BL and the silicon nitride film 54 are formed into a bit-line pattern. As a result, as shown in FIGS. 21A to 21C, bit lines BL are formed.

In this case, as described above with reference to FIGS. 6A and 6B, a bit line BL is not formed right above the corresponding lower diffusion layer 21 but at a position offset therefrom in the Y-direction by about half the Y-direction length of the bit line BL. Accordingly, as described above, both the connection of the bit line BL to the lower diffusion layer 21 through the bit line contact plug 23, and the connection of the lower electrode 70 to the upper diffusion layer 20 through the storage node contact plug 22 can be realized without bending the bit line BL.

Figure 22A:
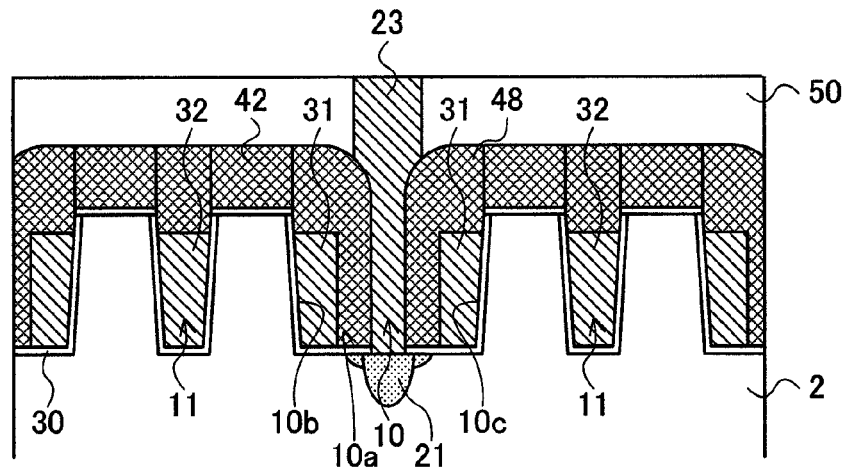
Figures 22B, 22C:
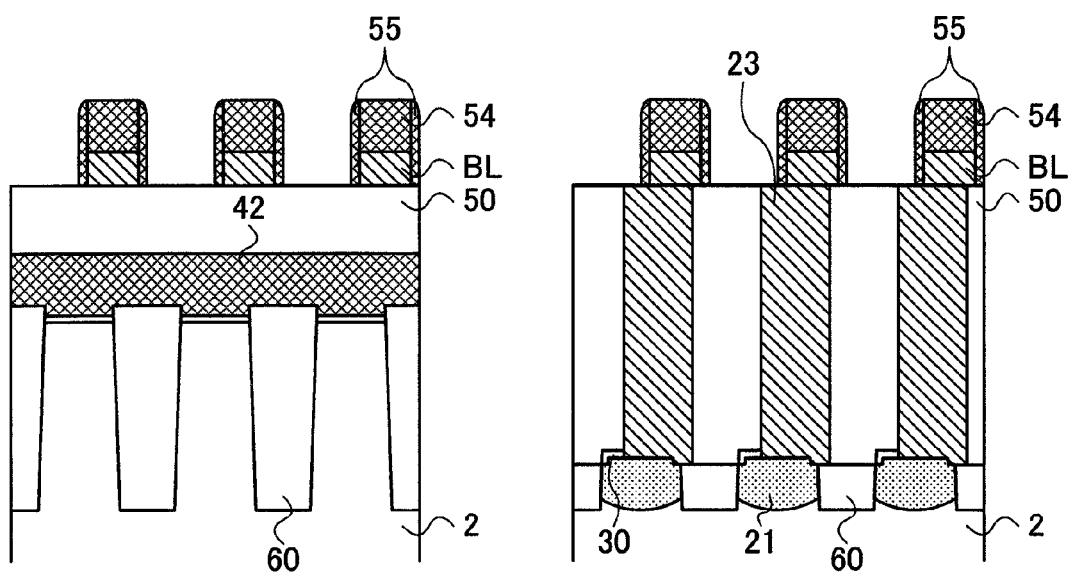

After the bit lines BL are formed, a silicon nitride film covering the bit lines BL is formed and formed into a sidewall shape by etch-back. As a result, as shown in FIGS. 22A to 22C, sidewall insulating films 55 are formed on side faces of the bit lines BL; the top surfaces and side faces of the bit lines BL are covered with silicon nitride films (second silicon nitride films).

Figure 23A:
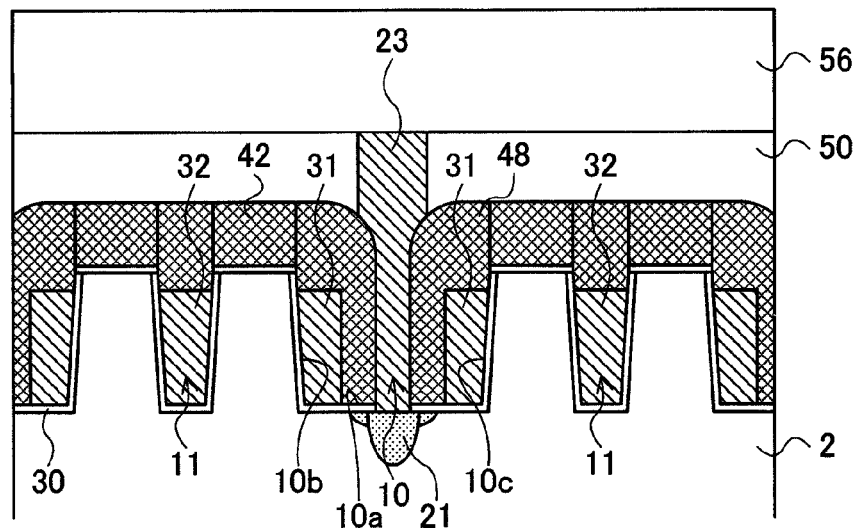
Figure 23B:
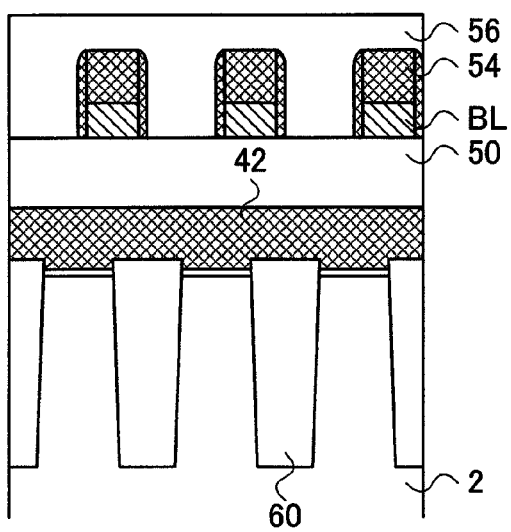
Figure 23C:
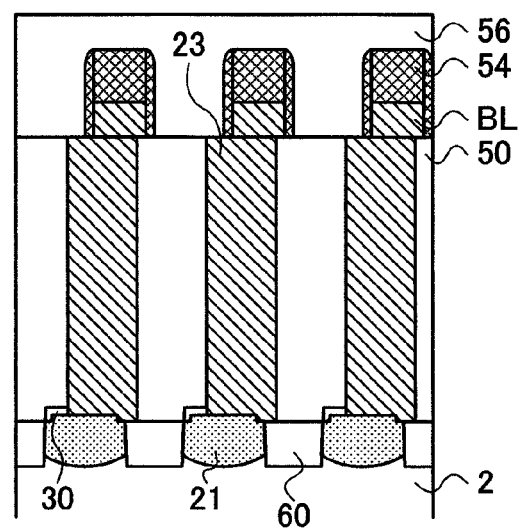

Then, as shown in FIGS. 23A to 23C, a silicon oxide film 56 (second silicon oxide film) is so formed as to have a thickness that enables the bumps formed by the bit lines BL and silicon nitride films 54 to be sufficiently filled. It is preferred that a surface of the silicon oxide film 56 be flattened by a CMP method.

Then, a resist 57 is applied to the surface of the silicon oxide film 56, and a lithographic technique is used to form a resist pattern having an opening in an area where a storage node contact plug 22 is formed. Then, with the use of an anisotropic dry etching that uses the above resist pattern, the etching of the silicon oxide film 56 and the like takes place to expose the surface of the silicon substrate 2. As a result, as shown in FIGS. 24A to 24C, contact holes 58 (second contact holes) are formed in order to make storage node contact plugs 22. Even in the anisotropic dry etching, a highly selective etching with a sufficiently small etching rate of the silicon nitride film relative to the etching rate of the silicon oxide film is used. Therefore, most of the silicon nitride films 54 covering the bit lines BL and of the sidewall insulating films 55 are not etched. Thus, it is possible to leave the bit lines BL as shown in FIG. 24B.

Then, an ion implantation method is used to implant a relatively high level of impurity ions in the exposed surface of the silicon substrate 2. As described above, the amount of ions to be implanted is so set that the top surfaces of the cell gate electrodes 31 and the bottom faces of the upper diffusion layers 20 are positioned at the same height. Thus, as shown in FIGS. 25A to 25C, the upper diffusion layers 20, whose lower surfaces are equal in height to the top surfaces of the cell gate electrodes 31, are formed. Then, the resist 57 is removed, and a conducting film is formed so as to have a thickness that enables the insides of the contact holes 58 to be completely filled. Then, the conducting film is flattened by a CMP method, and storage node contact plugs 22 are formed. More specifically, a metal film, such as tungsten, may be used as a material of the storage node contact plugs 22.

Finally, as shown in FIGS. 5 and 6, capacitors are formed on an upper layer of the silicon oxide film 56. Furthermore, on an upper layer thereof, essential wires are formed. As a result, the semiconductor device 1 is completed.

As described above, according to the present manufacturing method, it is possible to produce the semiconductor device 1 having a cell transistor of a single-side sidewall gate type and a field-shield transistor of a trench type.

Figure 26:
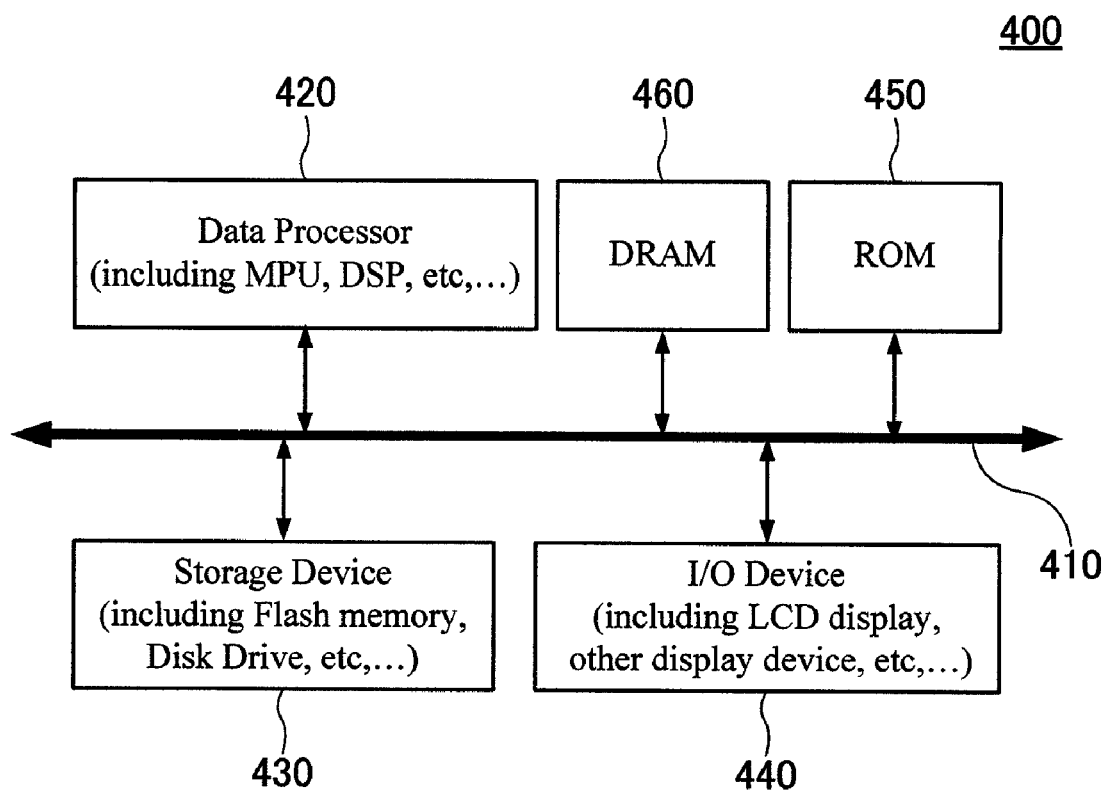
FIG. 26 shows a data processing system based on the another embodiment of the present invention.

FIG. 26 shows a data processing system 400 based on the another embodiment of the present invention. The data processing system 400 includes a computer system, for example, but not limited thereto. The data processing system 400 includes a data processor 420 and a DRAM 460 (a memory device) corresponding to the semiconductor device 1 described above. The data processor 420 includes a microprocessor (MPU) or digital signal processor (DSP), for example, but not limited thereto. In FIG. 26, the data processor 420 is connected to the DRAM 460 via a system bus 410 for simplicity. However, the data processor 420 may be connected by some local buses without involving the system bus 410.

Further, though only one system bus 410 is depicted in FIG. 26 for simplicity, the system buses 410 may be connected in serial or in parallel via some connectors and the like if needed. Also, if needed, a storage device 430, I/O device 440, ROM 450 can be connected to the system buses 410, though these components are not fundamental. Incidentally, I/O device 440 may have both of an input device and an output device or only one of them. Further, though the number of each components is confined to only 1 in FIG. 26 for simplicity, the numbers is not limited to 1. The number of at least one of the components may be plural.

It is apparent that the present invention is not limited to the above embodiments, but may be modified and changed without departing from the scope and spirit of the invention.

In addition, while not specifically claimed in the claim section, the applicant reserves the right to include in the claim section of the application at any appropriate time the following methods and systems:

A1. A method of manufacturing a semiconductor device comprising:
forming a cell gate trench and a field-shield gate trench on a semiconductor substrate, the cell gate trench having a bottom surface and first and second side surfaces, the field-shield gate trench being narrower in width than the cell gate trench;
forming a gate insulating film on inner surfaces of the cell gate trench and the field-shield gate trench;
forming a word-line material on the first and second side surfaces via the gate insulating film;
forming a first insulating film comprising a first insulating material covering the word-line material;
etching-back the first insulating film to form an opening on the first insulating film that exposes the bottom surface;
implanting impurity through the opening to form a lower diffusion layer on the bottom surface;
forming a bit line contact plug being in contact with the lower diffusion layer;
implanting impurity in the semiconductor substrate provided between the cell gate trench and the field-shield gate trench to form an upper diffusion layer; and
forming a storage node contact plug being in contact with the top diffusion layer.

A2. The method of manufacturing the semiconductor device as A1, wherein the word-line material is formed so that the bottom surface is exposed by the etching-back the first insulating film.

A3. The method of manufacturing the semiconductor device as A1, further comprising:
forming a second insulating film comprising a second insulating material different from the first insulating material on the first insulating film; and
forming a first contact hole in the second insulating film to expose the lower diffusion layer via the opening, wherein the bit line contact plug is formed in the first contact hole.

A4. The method of manufacturing the semiconductor device as A3, wherein the first contact hole is formed using a selective etching having a small etching rate of the first insulating material relative to an etching rate of the second insulating material.

A5. The method of manufacturing the semiconductor device as A3, further comprising:
forming a bit-line material on the second insulating film after the bit line contact plug is formed; and
forming a bit line by patterning of the bit-line material, wherein the bit line is formed at a position offset by a predetermined distance in a word-line direction from an area right above the lower diffusion layer.

A6. The method of manufacturing the semiconductor device as A5, wherein the bit line has a top surface and side surfaces that are covered with a third insulating film comprising the first insulating material,
the method further comprising:
forming a fourth insulating film comprising the second insulating material covering the third insulating film; and
forming a second contact hole in the fourth insulating film to expose the upper diffusion layer, wherein
the storage node contact plug is formed in the second contact hole.

A7. The method of manufacturing the semiconductor device as A6, wherein the second contact hole is formed using a selective etching having a small etching rate of the first insulating material relative to an etching rate of the second insulating material.

A8. A data processing system comprising:
a data processor; and
a memory device connected to the data processor, wherein the memory device comprising:
a semiconductor substrate including first, second and third portions;
the first and second portions being partitioned by a cell gate trench having a bottom surface, a first side surface located on the first portion side, and a second side surface located on the second portion side,
the first and third portions being partitioned by a first field-shield gate trench exposing a third side surface located on the first portion side and a fourth side surface located on the third portion side, and
a distance between the third and fourth surfaces being narrower than a distance between the first and second surfaces,
a first upper diffusion layer that is provided on an upper part of the first portion of the semiconductor substrate;
a second upper diffusion layer that is provided on an upper part of the second portion of the semiconductor substrate;
a third upper diffusion layer that is provided on an upper part of the third portion of the semiconductor substrate;
a lower diffusion layer that is provided in the bottom surface of the cell gate trench;
a first and a second storage element that are electrically connected to the first and second upper diffusion layers, respectively;

a bit line that is electrically connected to the lower diffusion layer;

a first and a second cell gate electrode that cover the first and second side surfaces, respectively, via a gate insulating film; and a first field-shield gate electrode that is embedded in the first field-shield gate trench via a gate insulating film.

What is claimed is:

1. A semiconductor device comprising:
a semiconductor substrate including first, second and third portions;
the first and second portions being partitioned by a cell gate trench having a bottom surface, a first side surface located on the first portion side, and a second side surface located on the second portion side,
the first and third portions being partitioned by a first field-shield gate trench exposing a third side surface located on the first portion side and a fourth side surface located on the third portion side, and
a distance between the third and fourth surfaces being narrower than a distance between the first and second surfaces,
a first upper diffusion layer that is provided on an upper part of the first portion of the semiconductor substrate;
a second upper diffusion layer that is provided on an upper part of the second portion of the semiconductor substrate;
a third upper diffusion layer that is provided on an upper part of the third portion of the semiconductor substrate;
a lower diffusion layer that is provided in the bottom surface of the cell gate trench;
a first and a second storage element that are electrically connected to the first and second upper diffusion layers, respectively;
a bit line that is electrically connected to the lower diffusion layer;
a first and a second cell gate electrode that cover the first and second side surfaces, respectively, via a gate insulating film; and
a first field-shield gate electrode that is embedded in the first field-shield gate trench via a gate insulating film.

2. The semiconductor device as claimed in claim 1, wherein
the first cell gate electrode, the first upper diffusion layer and the lower diffusion layer constitute a first cell transistor,
the second cell gate electrode, the second upper diffusion layer and the lower diffusion layer constitute a second cell transistor, and
the first field-shield gate electrode and the first and third upper diffusion layers constitute a first field-shield transistor.

3. The semiconductor device as claimed in claim 2, wherein the first field-shield gate electrode is supplied with a voltage less than a threshold voltage of the first field-shield transistor.

4. The semiconductor device as claimed in claim 1, wherein each of the first and second cell gate electrodes comprises a sidewall conducting film formed on corresponding one of the first and second side surfaces.

5. The semiconductor device as claimed in claim 1, wherein
the first upper diffusion layer is provided so as to be in contact with upper ends of the cell gate trench and the first field-shield gate trench,
the second upper diffusion layer is provided so as to be in contact with an upper end of the cell gate trench, and
the third upper diffusion layer is provided so as to be in contact with an upper end of the first field-shield gate trench.

6. The semiconductor device as claimed in claim 1, further comprising a bit line contact plug that electrically connects the lower diffusion layer and the bit line, wherein
at least a portion of the bit line contact plug is provided in a region between the first cell gate electrode and the second cell gate electrode in the cell gate trench.

7. The semiconductor device as claimed in claim 1, wherein
the semiconductor substrate further includes a fourth portion,
the second and fourth portions are partitioned by a second field-shield gate trench having a fifth side surface located on the second portion side and a sixth side surface located on the second portion side, and
a distance between the fifth and sixth surfaces is narrower than the distance between the first and second surfaces,
the semiconductor device further comprising:
a fourth upper diffusion layer that is provided on an upper part of the fourth portion of the semiconductor substrate; and
a second field-shield gate electrode that is embedded in the second field-shield gate trench via a gate insulating film, wherein
the second field-shield gate electrode and the second and fourth upper diffusion layers constitute a second field-shield transistor, and
the second field-shield gate electrode is supplied with a voltage less than a threshold voltage of the second field-shield transistor.

8. A semiconductor device comprising:
a semiconductor substrate having a plurality of cell gate trenches and a plurality of field-shield gate trenches that extend to a first direction in parallel, the cell gate trenches and the field-shield gate trenches are disposed so as to alternately appear in a second direction, each of the cell gate trenches exposing a bottom surface and first and second side surfaces of the semiconductor substrate, and each of the cell gate trenches is wider in the second direction than each of the field-shield gate trenches;
a plurality of upper diffusion layers, each of which is provided on an upper part of the semiconductor substrate provided between an associated one of the cell gate trenches and an associated one of the field-shield gate trenches;
a plurality of lower diffusion layers, each of which is provided in an associated one of the bottom surfaces;
a plurality of storage elements, each of which is electrically connected to an associated one of the upper diffusion layers;
a plurality of bit lines extending to the second direction, each of which is electrically connected to an associated one of the lower diffusion layers;
a plurality of first cell gate electrodes, each of which covers the first side surface exposed on an associated one of the cell gate trenches via a gate insulating film;
a plurality of second cell gate electrodes, each of which covers the second side surface exposed on an associated one of the cell gate trenches via a gate insulating film; and
a plurality of field-shield gate electrodes, each of which is embedded in an associated one of the field-shield gate trenches via a gate insulating film.

9. The semiconductor device as claimed in claim 8, wherein each of the first cell gate electrodes and the upper diffusion layer and lower diffusion layer that are each adjacent to the first cell gate electrode constitute a first cell transistor, each of the second cell gate electrode and the upper diffusion layer and lower diffusion layer that are each adjacent to the second cell gate electrode constitute a second cell transistor, and each of the field-shield gate electrode and two of the upper diffusion layers that are each adjacent to the field-shield gate electrode constitute a field-shield transistor.

10. The semiconductor device as claimed in claim 9, wherein each of the field-shield gate electrodes is supplied with a voltage less than a threshold voltage of the corresponding field-shield transistor.

11. The semiconductor device as claimed in claim 8, wherein each of the first and second cell gate electrodes comprises a sidewall conducting film formed on an associated one of the first and second side surfaces.

12. The semiconductor device as claimed in claim 8, wherein each of the upper diffusion layers is provided as to be in contact with upper ends of the adjacent cell gate trenches and field-shield gate trenches.

13. The semiconductor device as claimed in claim 8, further comprising a plurality of bit line contact plugs that are provided for each of the lower diffusion layers to electrically connect the corresponding lower diffusion layers and the corresponding bit lines, wherein at least a portion of each of the bit line contact plugs is provided in a region between the first cell gate electrode and the second cell gate electrode in the corresponding cell gate trench.

* * * * *